United States Patent
Kim

(10) Patent No.: US 11,908,871 B2
(45) Date of Patent: Feb. 20, 2024

(54) FLEXIBLE DISPLAY DEVICE

(71) Applicant: Samsung Display Co., Ltd., Yongin-si (KR)

(72) Inventor: Keun Woo Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 290 days.

(21) Appl. No.: 17/229,647

(22) Filed: Apr. 13, 2021

(65) Prior Publication Data
US 2021/0358967 A1 Nov. 18, 2021

(30) Foreign Application Priority Data

May 14, 2020 (KR) .......................... 10-2020-0057649

(51) Int. Cl.
*H01L 27/12* (2006.01)
*G09F 9/30* (2006.01)
*H10K 77/10* (2023.01)

(52) U.S. Cl.
CPC .......... *H01L 27/1218* (2013.01); *G09F 9/301* (2013.01); *H01L 27/124* (2013.01); *H10K 77/111* (2023.02)

(58) Field of Classification Search
CPC .. H01L 27/1218; H01L 27/124; H10K 77/111
USPC ..................................................... 349/42–47
See application file for complete search history.

(56) References Cited

U.S. PATENT DOCUMENTS

| | | | | |
|---|---|---|---|---|
| 7,148,506 B2* | 12/2006 | Zhang | ..................... | H01L 27/12 349/44 |
| 8,350,267 B2* | 1/2013 | Koo | ................... | H01L 29/78672 257/66 |
| 2005/0269568 A1* | 12/2005 | Koo | ..................... | H10K 10/466 257/59 |
| 2006/0290633 A1* | 12/2006 | Choi | ................. | H01L 29/78645 257/E27.111 |

(Continued)

FOREIGN PATENT DOCUMENTS

| | | |
|---|---|---|
| JP | 2004-340981 A | 12/2004 |
| JP | 5186190 B2 | 4/2013 |

(Continued)

OTHER PUBLICATIONS

Chen, Bo-Wei et al.; "Effects of Repetitive Mechanical Bending Strain on Various Dimensions of Foldable Low Temperature Polysilicon TFTs Fabricated on Polyimide"; IEEE Electron Device Letters; vol. 37; No. 8; Aug. 2016; pp. 1010-1013.

*Primary Examiner* — Charles S Chang
(74) *Attorney, Agent, or Firm* — Lewis Roca Rothgerber Christie LLP

(57) ABSTRACT

A flexible display device includes: a flexible substrate; a semiconductor layer on the flexible substrate, the semiconductor layer including a polycrystalline semiconductor; a gate insulation layer on the semiconductor layer; and a gate electrode on the gate insulation layer, the gate electrode overlapping a channel region of the semiconductor layer in a plan view, wherein the semiconductor layer includes a source region and a drain region that are at opposite sides of the channel region, wherein the channel region includes a first region contacting the source region and a second region contacting the drain region, and wherein a channel width of the first region is greater than a channel width of the second region.

19 Claims, 19 Drawing Sheets

(56) References Cited

U.S. PATENT DOCUMENTS

2011/0169001 A1* 7/2011 Ozeki ............... H01L 29/78696
438/149
2019/0074377 A1* 3/2019 Park ........................ H01L 29/24

FOREIGN PATENT DOCUMENTS

| JP | 5600255 B2 | 10/2014 |
|----|------------|---------|
| KR | 10-1176540 B1 | 8/2012 |
| KR | 10-2021-0022807 A | 3/2021 |
| KR | 2021-0059834 A | 5/2021 |

* cited by examiner

FLEXIBLE DISPLAY DEVICE

CROSS-REFERENCE TO RELATED APPLICATION

This application claims priority to and the benefit of Korean Patent Application No. 10-2020-0057649 filed in the Korean Intellectual Property Office (KIPO) on May 14, 2020, the entire contents of which are incorporated herein by reference.

BACKGROUND

1. Field

The present disclosure relates to a flexible display device, and more specifically, it relates to a display device that includes a light emitting diode and can be folded and unfolded by having a flexible characteristic.

2. Description of the Related Art

A display device is an image display device, and recently, a light emitting display device that emits light itself, such as, for example, an organic light emitting diode display, has attracted attention.

Because the organic light emitting diode display has a self-luminance characteristic and does not require a separate light source, unlike a liquid crystal display, thickness and weight thereof may be reduced. Further, the organic light emitting diode display has high-grade characteristics such as low power consumption, high luminance, and a high response speed.

Because the light emitting display device emits light by itself, it is possible to make light emitting diodes of each pixel individually or independently emit light. For this purpose, a light emitting driver and a scan driver may be included, and a light emitting signal is transmitted to each pixel to allow the organic light emitting diode to emit light.

The light emitting display device may also be a flexible display device in which the display device can bend.

The above information disclosed in this Background section is only for enhancement of understanding of the background of the present disclosure, and therefore it may contain information that does not constitute prior art.

SUMMARY

Aspects of one or more exemplary embodiments are directed towards a flexible display device including a transistor of which an output current is not decreased even though mechanical stress or electrical stress occurs while folding or unfolding the display device or maintaining the folded state.

A flexible display device according to an exemplary embodiment includes: a flexible substrate; a semiconductor layer on the flexible substrate, the semiconductor layer including a polycrystalline semiconductor; a gate insulation layer on the semiconductor layer; and a gate electrode on the gate insulation layer, the gate electrode overlapping a channel region of the semiconductor layer in a plan view, wherein the semiconductor layer includes a source region and a drain region that are at opposite sides of the channel region, wherein the channel region includes a first region contacting the source region and a second region contacting the drain region, and wherein a channel width of the first region is greater than a channel width of the second region.

A width of the drain region may be greater than the channel width of the second region, and a width of the source region may be less than the channel width of the first region.

A width of the drain region may be equal to the channel width of the second region, and a width of the source region may be less than the channel width of the first region.

A width of the drain region may be equal to the channel width of the second region, and a width of the source region may be equal to the channel width of the first region.

The semiconductor layer and the gate electrode may each have a bent structure.

A width of the drain region may be equal to the channel width of the second region, and a width of the source region may be equal to the channel width of the first region.

The channel region may include a middle area that is between the first region and the second region.

A channel width changes along the middle area of the channel region.

The flexible substrate may include a display area and a non-display area, a plurality of pixels being at the display area and a driver to apply a driving signal to the plurality of pixels being at the non-display area, wherein the driver comprises a transistor comprising the source region, the channel region, the drain region, and the gate electrode.

The driver may include a light emitting driver to provide a light emitting signal to the plurality of pixels, the light emitting driver including a plurality of stages.

The plurality of stages of the light emitting driver may include: a high-level output portion to output a high voltage of the light emitting signal according to a voltage of a first node; a low-level output portion to output a low voltage of the light emitting signal according to a voltage of a second node; a first node controller to control the first node, the first node controller including a first node_first controller and a first node_second controller; a second node controller to control the second node, the second node controller including a second node_first controller and a second node_second controller; and a third node controller to control a voltage of a third node that controls the first node_second controller.

At least one of the second node controller or the third node controller comprises the transistor.

The second node_first controller may include a first transistor including a control electrode connected to a first clock input terminal, an input electrode connected to a control terminal, and an output electrode connected to the second node, wherein the second node_second controller may include: the transistor, which is a second transistor, further including a control electrode connected to the third node and an input electrode to receive the high voltage of the light emitting signal; and a third transistor including a control electrode connected to a second clock input terminal, an input electrode connected to an output electrode of the second transistor, and an output electrode connected to the second node, wherein the third node controller may include: a fourth transistor including a control terminal connected to the second node, an input terminal connected to the first clock input terminal, and an output terminal connected to the third node, and a fifth transistor including a control terminal connected to the first clock input terminal, an input terminal to receive the low voltage of the light emitting signal, and an output terminal connected to the third node.

A flexible display device according to an exemplary embodiment includes: a flexible substrate; a semiconductor layer on the flexible substrate, the semiconductor layer including a polycrystalline semiconductor; a gate insulation layer on the semiconductor layer; and a gate electrode on the gate insulation layer, wherein the semiconductor layer may include a channel region, a source region, and a drain region, the source region and the drain region being at opposite sides of the channel region, wherein the gate electrode may include a linear portion extending in a direction crossing the semiconductor layer and a protrusion portion protruded from the linear portion, and wherein the protrusion portion may overlap the channel region of the semiconductor layer in a plan view.

The drain region, the source region, and the channel region may have a same width.

The drain region, the source region, and the channel region may have a same width.

The channel region may include a portion overlapping the linear portion and a portion overlapping the protrusion portion of the gate electrode.

A flexible display device according to an exemplary embodiment includes: a flexible substrate; a semiconductor layer on the flexible substrate, the semiconductor layer including a polycrystalline semiconductor; a gate insulation layer on the semiconductor layer; and a gate electrode on the gate insulation layer, wherein the semiconductor layer includes a channel region, a source region, and a drain region, the source region and the drain region being at opposite sides of the channel region, wherein the semiconductor layer and the gate electrode each have bent structure, wherein the channel region and the gate electrode overlap each other in a plan view, and wherein the channel region is at a portion where the semiconductor layer is bent.

The channel region may include a first region contacting the source region and a second region contacting the drain region, and a channel width of the first region may be greater than a channel width of the second region.

The semiconductor layer may further include a non-channel region contacting the channel region, the non-channel region being apart from the source region and the drain region, and the non-channel region may be doped and does not overlap with the gate electrode in a plan view.

According to the exemplary embodiments, the channel width of the channel region contacting the source region may be larger than the channel width of the channel region contacting the drain region in the semiconductor layer of the transistor formed in the flexible display device such that an output current of the transistor is not reduced even when strong mechanical stress or electrical stress is applied. In addition, depending on exemplary embodiments, a thin film transistor of which an output current is not reduced is included in a driver that drives the flexible display device, thereby eliminating a display problem such as a flicker, which occurs due to a decrease of a driving signal.

DETAILED DESCRIPTION

Figure 1:
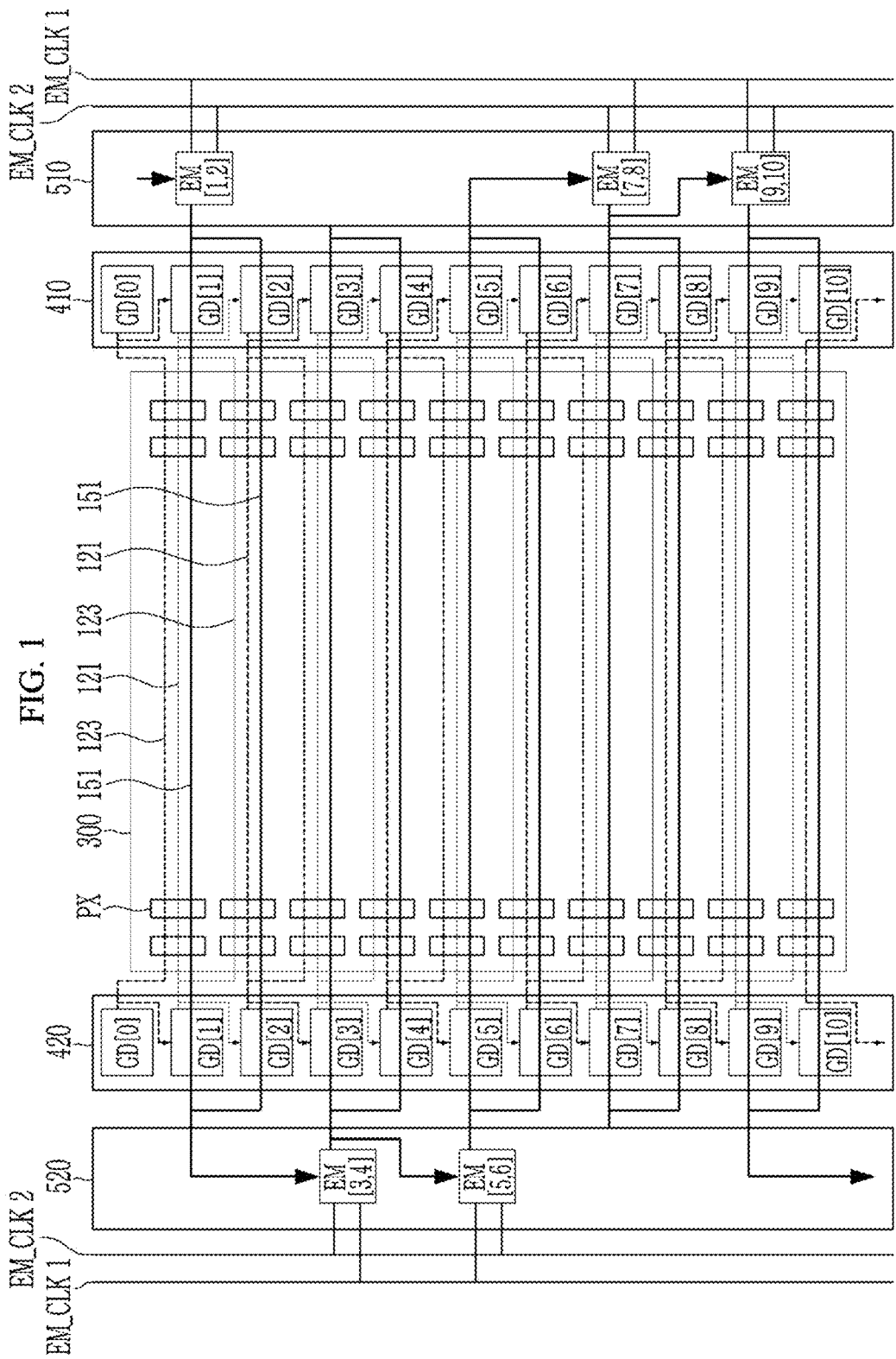
FIG. 1 is a block diagram of a light emitting display device according to an exemplary embodiment.

Hereinafter, the present disclosure will be described more fully with reference to the accompanying drawings, in which exemplary embodiments of the invention are shown. As those skilled in the art would realize, the described embodiments may be modified in various different ways, all without departing from the spirit or scope of the present disclosure.

The drawings and description are to be regarded as illustrative in nature and not restrictive. Like reference numerals designate like elements throughout the specification.

In addition, because the size and thickness of each component shown in the drawings are arbitrarily shown for better understanding and ease of description, the present disclosure is not necessarily limited to what is shown. In the drawings, the thickness of layers, films, panels, regions, etc., are exaggerated for clarity. In addition, in the drawings, for better understanding and ease of description, the thickness of some layers and regions is exaggerated.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the term "and/or" includes any and all combinations of one or more of the associated listed items.

Further, the use of "may" when describing embodiments of the present disclosure refers to "one or more embodiments of the present disclosure".

It will be understood that when an element is referred to as being "on," "connected to," or "coupled to" another element, it may be directly on, connected, or coupled to the other element or one or more intervening elements may also be present. When an element is referred to as being "directly on," "directly connected to," or "directly coupled to" another element, there are no intervening elements present.

As used herein, the terms "substantially," "about," and similar terms are used as terms of approximation and not as terms of degree, and are intended to account for the inherent deviations in measured or calculated values that would be recognized by those of ordinary skill in the art.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to be positioned above or below the target element and may not necessarily be positioned "at an upper side" based on a direction opposite to a gravity direction.

Further, throughout the specification, the phrase "on a cross-section" or "a cross-sectional view" refers to a viewing a cross-section formed on a plane cutting through a target object.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a light emitting display device according to an exemplary embodiment will be described with reference to FIG. 1.

FIG. 1 is a block diagram of a light emitting display device according to an exemplary embodiment.

A light emitting display device according to an exemplary embodiment includes a display panel that includes a flexible substrate such as polyimide (PI) or a film and thus it has a bendable characteristic. In one or more embodiments, the display panel may have a bent structure or may be foldable and unfoldable. In addition, the display panel may be divided (e.g., broadly divided) into a display area 300 and a non-display area.

A plurality of pixels PX are formed in the display area 300, and various suitable drivers for driving the pixels PX are provided in the non-display area. In FIG. 1, scan drivers 410 and 420 are respectively disposed at the right and left sides of the display area 300, and light emitting drivers 510 and 520 are respectively disposed at the right and left sides of the display area 300 as pairs. In one or more embodiments, a data driver that applies a data voltage to the pixel PX is further provided in the non-display area. In addition, a voltage such as a driving voltage, a driving low voltage, an initialization voltage, and/or the like may be applied to the pixel PX.

The plurality of pixels PX are arranged in a column direction and a row direction in the display area 300. In one or more embodiments, the pixel PX of the light emitting display device includes a pixel circuit portion formed on a substrate and a light emitting element portion formed on the pixel circuit portion.

The light emitting element portion includes a light emitting diode, and receives a current from the pixel circuit portion. In one or more embodiments, the light emitting element portion emits light with a luminance degree that changes depending on intensity of the current (e.g., the magnitude or amount of the current provided to the light emitting diode). Here, the light emitting diode may include an organic emission layer or an inorganic emission layer.

The pixel PX having a quadrangular shape shown in FIG. 1 is illustrated with reference to the pixel circuit portion. The pixel circuit portion includes a plurality of transistors and a capacitor, and is connected with a scan line 121, a previous scan line 123, and a light emitting signal line 151. The plurality of transistors according to the present exemplary embodiment may include polycrystalline semiconductors. The pixel circuit portion is formed in the shape of a quadrangle and arranged in a matrix format in the row and column directions. The light emitting element portion may have a quadrangle shape such as a rhombus, or may have a shape other than a quadrangle, and the arrangement may also be arranged in various suitable structures.

The pixel PX is connected with the scan line 121, the previous scan line 123, and the light emitting signal line 151. The scan line 121, the previous scan line 123, and the light emitting signal line 151 extend in a first direction (e.g., the row direction). In one or more embodiments, the pixel PX is connected with a data line that transmits a data voltage to the pixel PX from a data driver. The data line extends in a direction (e.g., the column direction) that is perpendicular to the first direction.

The non-display area is the peripheral area of the display area 300. In one or more embodiments, the scan drivers 410 and 420 are respectively disposed at the right and left sides of the display area 300 in the non-display area and the light emitting drivers 510 and 520 are respectively disposed at the right and left sides of the display area 300 in the non-display area. The scan drivers 410 and 420 are disposed at the non-display area close to the display area 300, and the light emitting drivers 510 and 520 are disposed at outer sides of the scan drivers 410 and 420. For example, each of the light emitting drivers 510 and 520 may be farther from the display area 300 than each of the scan drivers 410 and 420 are from the display area 300.

The scan drivers 410 and 420 include a first scan driver 410 disposed at the right side of the display area 300 and a second scan driver 420 disposed at the left side of the display area 300.

Each of the scan drivers 410 and 420 includes a plurality of scan signal stages GD. Each scan signal stage GD generates and outputs a gate signal, and the output gate signal is transmitted to pixels included in a pixel row of the present stage through the scan line 121 and applied to pixels PX included in the next pixel row through the previous scan line 123. In addition, each scan signal stage GD applies a gate signal as a carry signal to a scan signal stage GD of the next scan signal stage GD. One scan line 121 and one previous scan line 123 may receive the same gate signal from both of the first scan driver 410 and the second scan driver 420. A gate-on voltage and a gate-off voltage of the gate signal are alternately applied, and at least one gate-on voltage is included during one frame. Depending on exemplary embodiments, the gate-on voltage and the gate-off voltage may be applied a plurality of times (i.e., more than once) during one frame.

The scan drivers 410 and 420 may further include 0-th scan signal stage GD[0] to apply the gate signal to the previous scan line 123 connected to the pixels PX of the first pixel PX.

The light emitting drivers 510 and 520 are disposed at the outer side of the scan drivers 410 and 420. The first light emitting driver 510 is disposed at the right side of the display area 300, and the second light emitting driver 520 is disposed at the left side of the display area 300.

Each of the light emitting drivers 510 and 520 includes a plurality of light emitting signal stages EM. One light emitting signal line 151 is connected with only one corresponding light emitting signal stage EM, and receives a light emitting signal from one light emitting signal stage EM.

Thus, a light emitting signal stage EM that corresponds to a light emitting signal line 151 controlled by a light emitting signal stage EM disposed in the first light emitting driver 510 may not exist in the second light emitting driver 520.

In the exemplary embodiment of FIG. 1, a light emitting signal output from one light emitting signal stage EM may be concurrently (e.g., simultaneously) applied to pixels PX of two pixel rows. That is, the light emitting signal stage marked EM[1,2] in FIG. 1 indicates that the light emitting signal is applied concurrently (e.g., simultaneously) to the first pixel row and the second pixel row. However, depending on exemplary embodiments, the light emitting signal may be applied to only one pixel row or may be applied to three or more pixel rows concurrently (e.g., simultaneously). That is, one light emitting signal stage EM may be connected with n light emitting signal line(s) 151, and concurrently (e.g., simultaneously) applies a light emitting signal to pixels PX included in the n pixel row(s). Here, n is a natural number of 1 or more.

When the light emitting signal is applied, a low-level voltage (corresponding to a light emission period) and a high-level voltage (corresponding to a writing period) are alternately applied. In one frame, a high-level voltage section (writing period) is included once. In addition, the light emission period and the writing period divided by the light emitting signal is longer than a sustain period (also called 1H) of the gate-on voltage applied to one pixel PX. Due to such a feature, the light emitting signal can apply the light emitting signals concurrently (e.g., simultaneously) to a plurality of light emitting signal lines 151. However, the gate-on voltage is maintained for a very short 1H period, and thus the gate signal is applied to only one scan line 121 and one previous scan line 123 for each scan signal stage GD.

In addition, light emitting signal stages EM may be formed in respective light emitting drivers 510 and 520. In one or more embodiments, two adjacent light emitting signal stages EM may be positioned in the same light emitting drivers 510 and 520. However, depending on exemplary embodiments, the light emitting signal stages EM may be positioned alternately at opposite sides. For example, consecutive light emitting signal stages may be formed alternately in respective light emitting drivers such that two adjacent or consecutive light emitting signal stages are not positioned in the same light emitting drivers.

In addition, in the exemplary embodiment of FIG. 1, the scan drivers 410 and 420 are formed at opposite sides of the display area 300 and the light emitting drivers 510 and 520 are formed at opposite sides of the display area 300, but depending on exemplary embodiments, the scan drivers 410 and 420 may be formed at only one side of the display area 300, and the light emitting drivers 510 and 520 may be formed at only one side of the display area 300.

In addition, the scan drivers 410 and 420 and the light emitting drivers 510 and 520 are formed together during a process for forming a transistor and a light emitting diode included in a pixel PX of the display area 300. That is, the scan drivers 410 and 420 and the light emitting drivers 510 and 520 are formed through the same process as the pixel PX in the display panel, while having the same layer, and the scan drivers 410 and 420 and the light emitting drivers 510 and 520 include a transistor including polysilicon semiconductor as a semiconductor.

A connection structure of the light emitting drivers 510 and 520 of FIG. 1 will be described in more detail with reference to FIG. 2.

Figure 2:
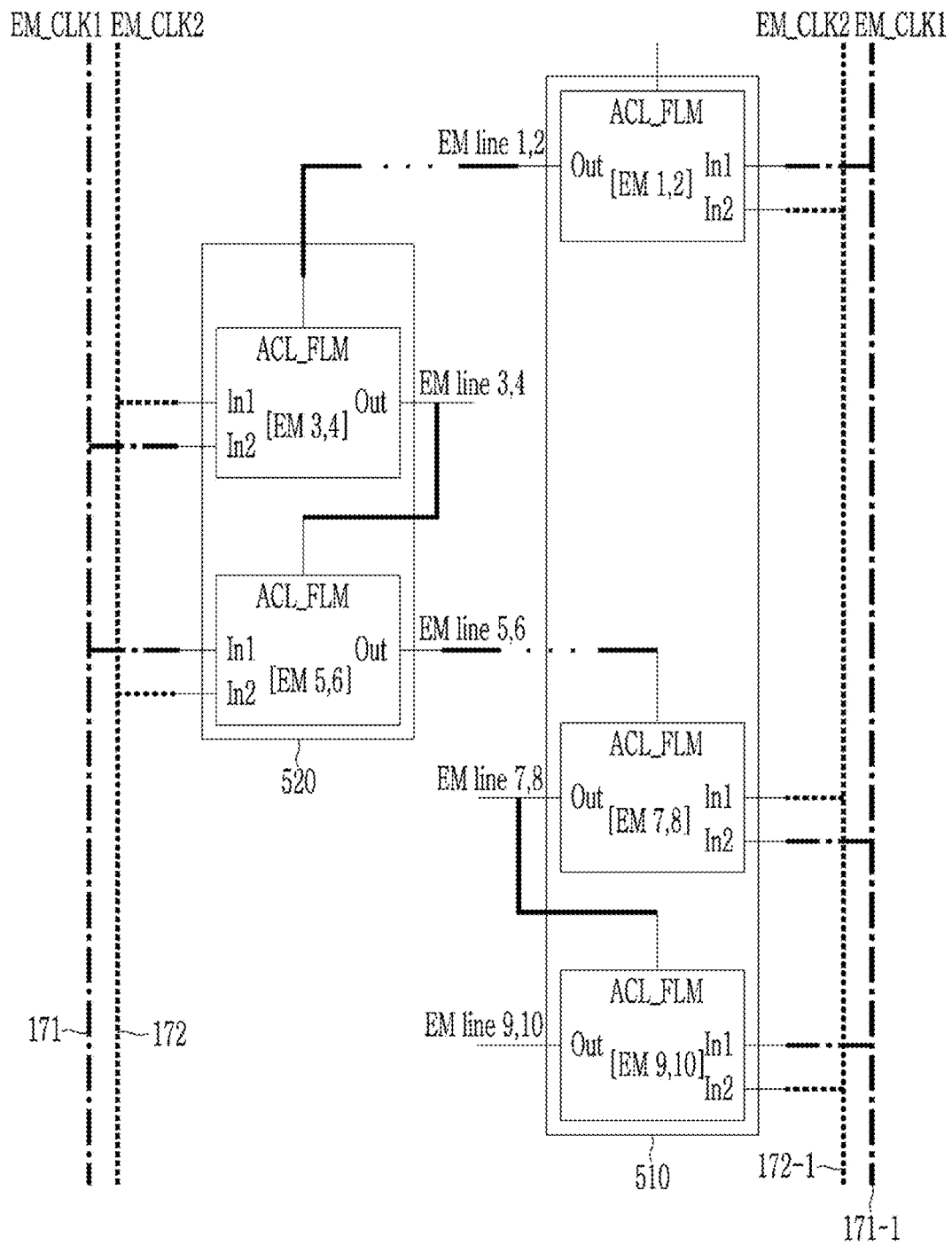
FIG. 2 is a block diagram of a light emitting driver according to an exemplary embodiment.

FIG. 2 is a block diagram of a light emitting driver according to an exemplary embodiment.

FIG. 2 illustrates a plurality of light emitting signal stages EM positioned in the first light emitting driver 510 and the second light emitting driver 520. In addition, as shown in FIG. 1, in the exemplary embodiment of FIG. 2, two light emitting signal lines 151 are connected to each light emitting signal stage EM.

Each light emitting signal state EM of the light emitting drivers 510 and 520 include a first clock input terminal In1 and a second clock input terminal In2 that respectively receive two clock signals, a control terminal ACL_FLM that receives a control signal FLM or a light emitting signal of the previous stage, and an output terminal Out that outputs a light emitting signal.

A connection relationship of each light emitting signal stage EM will now be described.

A light emitting signal stage EM[1,2] (hereinafter also referred to as a first light emitting signal stage) that applies a light emitting signal to the first and second light emitting signal lines EM line 1 and EM line 2 are disposed in the first light emitting driver 510 that is disposed at the right side of the display area 300. Pixels PX connected to the first pixel row and the second pixel row receive the light emitting signal through the first light emitting signal stage EM[1,2]. Thus, all the pixels PX connected to the first pixel row and the second pixel row have light emission periods and writing periods at the same or substantially the same timing, and concurrently (e.g., simultaneously) emit light when the light emission period starts.

A control signal FLM is applied to the control terminal ACL_FLM from the outside in the first light emitting signal stage EM[1,2], a first clock signal EM_CLK1 is applied to the first clock input terminal In1, and a second clock signal EM_CLK2 is applied to the second clock input terminal In2. In addition, light emitting signals are applied to the first and second light emitting signal lines EM line 1 and EM line 2 through the output terminal Out.

Meanwhile, the light emitting signal output from the first light emitting signal stage EM[1,2] is transmitted to the second light emitting driver 520 as a carry signal and then applied to a control terminal ACL_FLM of the next light emitting signal stage EM[3,4].

A light emitting signal stage EM[3,4] (also referred to as a second light emitting signal stage) that applies a light emitting signal to the third and fourth light emitting signal lines EM lines 3 and 4 is disposed in the second light emitting driver 520 disposed at the left side of the display area 300. A light emitting signal is applied to pixels PX connected to the third pixel row and the fourth pixel row through the second light emitting signal stage EM[3,4]. Thus, all the pixels PX connected to the third pixel row and the fourth pixel row have light emission periods and writing periods at the same or substantially the same timing, and concurrently (e.g., simultaneously) emit light when the light emission period starts.

The light emitting signal is applied to the control terminal ACL_FLM as a carry signal to the second light emitting signal stage EM[3,4] from the first light emitting signal stage EM[1,2], the second clock signal EM_CLK2 is applied to the first clock input terminal In1, and the first clock signal EM_CLK1 is applied to the second clock input terminal In2. In addition, the light emitting signals are applied to the third and fourth light emitting signal lines EM lines 3 and 4 through the output terminal Out.

Meanwhile, a light emitting signal output from the second light emitting signal stage EM[3,4] is applied to a control terminal ACL_FLM of the third light emitting signal stage EM[5,6] in the second light emitting driver 520 as a carry signal.

A light emitting signal stage EM[5,6] (also referred to as a third light emitting signal stage) applying a light emitting signal to the fifth and sixth light emitting signal lines EM lines 5 and 6 is disposed below the second light emitting signal stage EM[3,4] in the second light emitting driver 520 disposed at the left side of the display area 300. That is, two adjacent light emitting signal stages are disposed in the same light emitting driver. The third light emitting signal stage EM[5,6] applies a light emitting signal to pixels PX connected to the fifth pixel row and the sixth pixel row. Thus, all the pixels PX connected to the fifth pixel row and the sixth pixel row have light emission periods and writing periods at the same or substantially the same timing, and concurrently (e.g., simultaneously) emit light when the light emission periods start.

The third light emitting signal stage EM[5,6] receives the light emitting signal through the control terminal ACL_FLM as a carry signal to from the second light emitting signal stage EM[3,4], the first clock signal EM_CLK1 is applied to the first clock input terminal In1, and the second clock signal EM_CLK2 is applied to the second input terminal In2. In addition, the light emitting signal is applied to the fifth and sixth light emitting signal lines EM lines 5 and 6 through the output terminal Out.

Meanwhile, the light emitting signal output from the third light emitting signal stage EM[5,6] is applied to the control terminal ACL_FLM of the fourth light emitting signal stage EM[7,8] in the first light emitting driver 510 as a carry signal.

A light emitting signal stage EM[7,8] (hereinafter referred to as a fourth light emitting signal stage) applying the light emitting signal to the seventh and eighth light emitting signal lines EM lines 7 and 8 is disposed in the first light emitting driver 510 located at the right side of the display area 300 at the below of the first light emitting signal stage EM[1,2]. Pixels connected to the seventh pixel row and the eighth pixel row are applied with (i.e., receive) the light emitting signals through the fourth light emitting signal stage EM[7,8]. Thus, all the pixels PX connected to the seventh pixel row and the eighth pixel row have light emission periods and writing periods at the same or substantially the same timing, and concurrently (e.g., simultaneously) emit light when the light emission periods start.

The fourth light emitting signal stage EM[7,8] receives the light emitting signal as a carry signal through the control terminal ACL_FLM from the third light emitting signal stage EM[5,6], the second clock signal EM_CLK2 is applied to the first clock input terminal In1, and the first clock signal EM_CLK1 is applied to the second clock input terminal In2. In addition, the light emitting signal is applied to the seventh and eighth light emitting signal lines EM lines 7 and 8 through the output terminal Out.

Meanwhile, the light emitting signal output from the fourth light emitting signal stage EM[7,8] is applied as a carry signal to the control terminal ACL_FLM of the fifth light emitting signal stage EM[9,10] in the first light emitting driver 510.

A light emitting signal stage EM[9,10] (hereinafter also referred to as a fifth light emitting signal stage) applying the light emitting signal to the ninth and tenth light emitting signal lines EM lines 9 and 10 is disposed in the first light emitting driver 510 disposed at the right side of the display area 300, and is disposed below the fourth light emitting signal stage EM[7,8]. That is, two adjacent light emitting signal stages are disposed in the same light emitting driver.

Pixels PX connected to the ninth pixel row and the tenth pixel row are applied with the light emitting signal through the fifth light emitting signal stage EM[9,10]. Thus, all the pixels PX connected to the ninth pixel row and the tenth pixel row have light emission periods and writing periods at the same or substantially the same timing, and concurrently (e.g., simultaneously) emit light when the light emission periods start.

The fifth light emitting signal stage EM[9,10] is applied with the light emitting signal as a carry signal from the fourth light emitting signal stage EM[7,8] through the control terminal ACL_FLM, the first clock input terminal In1 is applied with the first clock signal EM_CLK1, and the second clock input terminal In2 is applied with the second clock signal EM_CLK2. In addition, the light emitting signal is applied to the ninth and tenth light emitting signal lines EM lines 9 and 10 through the output terminal Out.

Meanwhile, the light emitting signal output from the fifth light emitting signal stage EM[9,10] is applied as a carry signal to a control terminal ACL_FLM of the sixth light emitting signal stage in the second light emitting driver 520.

In the same manner as above, the light emitting signal stage is formed in the first and second light emitting drivers 510 and 520, and pixels PX in two pixel rows in each light emitting signal stage emit light.

Depending on exemplary embodiments, one light emitting signal stage EM may be connected with any suitable number of pixel rows. For example, one light emitting signal stage EM may be connected with three or more pixel rows, or one light emitting signal stage EM may be connected with one pixel row.

In the present exemplary embodiment, two light emitting signal stages EM (e.g., two adjacent or consecutive light emitting stages EM) are continuously positioned in one light emitting driver 510 or 520. However, depending on exemplary embodiments, an even-number of light emitting signal stages EM (e.g., four light emitting signal stages EM or six light emitting signal stages EM) may be continuously formed in one of light emitting driver 510 or 520. In addition, depending on exemplary embodiments, one light emitting signal stage EM may be arranged alternately to the light emitting drivers 510 and 520 at both sides. For example, consecutive light emitting signal stages EM may be formed alternately in respective light emitting drivers 510 and 520 such that two adjacent or consecutive light emitting signal stages EM are not positioned in the same light emitting drivers 510 and 520.

As described, when an even-number of light emitting signal stages EM are formed in one light emitting driver 510 or 520, two pairs of clock signal wires 171 and 172, and 171-1 and 172-1, applying two clock signals EM_CLK1 and EM_CLK2 are alternately connected to the first clock input terminal In1 and the second clock input terminal In2 of the light emitting signal stage EM.

That is, referring to FIG. 2, among two clock signal wires 171 and 172 positioned at the left side of the display area 300, the first clock signal wire 171 is connected with the second clock input terminal In2 and the second clock signal wire 172 is connected with the first clock input terminal In1 in the second light emitting signal stage EM[3,4]. However, in the third light emitting signal stage EM[5,6] positioned below the second light emitting signal stage EM[3,4], the first clock signal wire 171 is connected with the first clock input terminal In1 and the second clock signal wire 172 is connected with the second clock input terminal In2. Thus, even when two clock input terminals In1 and In2 of the light emitting signal stage EM have a significantly different capacitance value, no load difference occurs between the two clock signal wires 171 and 172 disposed at the left side of the display area 300.

As a result, even when static electricity flows from the outside, it may not be transmitted through only a specific wire, and thus, a specific input terminal side of the light emitting signal stage may not be damaged by static electricity. In addition, there may be no delay occurring in the specific clock signal due to a load difference between the two clock signal wires 171 and 172.

Figure 3:
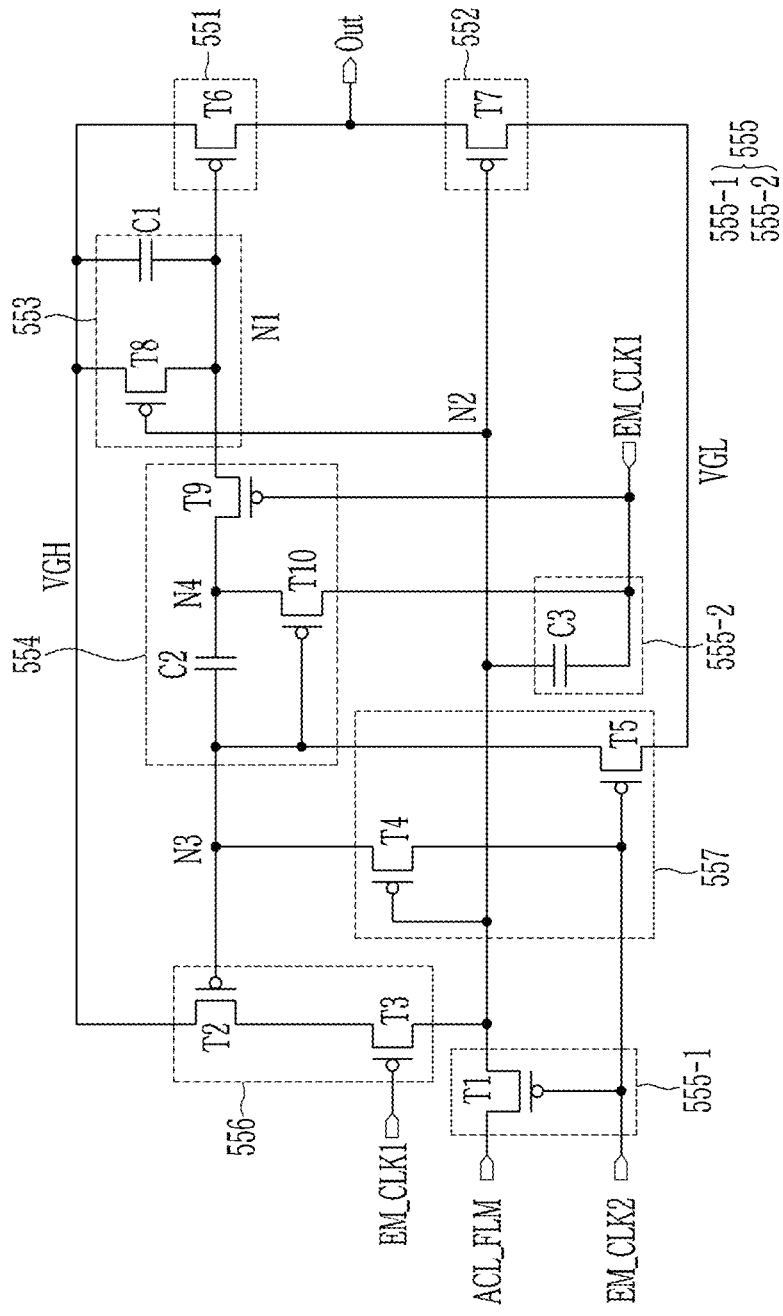
FIG. 3 is a circuit diagram of one stage of the light emitting driver according to the exemplary embodiment.

FIG. 3 is a circuit diagram of one stage of the light emitting driver according to the exemplary embodiment.

Each light emitting signal stage EM included in the light emitting drivers 510 and 520 of the present exemplary embodiment includes a high-level output portion 551, a low-level output portion 552, a first node_first controller 553, a first node_second controller 554, a second node_first controller 555, a second node_second controller 556, and a third node controller 557. Here, the first node_first controller 553 and the first node_second controller 554 may be referred to as a first node controller, and the second node_first controller 555 and the second node_second controller 556 may be referred to as a second node controller.

The high-level output portion 551 is a portion that outputs a high voltage VGH of the light emitting signal, and the low-level output portion 552 is a portion that outputs a low voltage VGL of the light emitting signal. The high-level output portion 551 and the low-level output portion 552 are connected to the output terminal Out, and when the high voltage VGH is output from the high-level output portion 551, the low-level output portion 552 does not output anything, and when the low-level output portion 552 outputs the low voltage VGL, the high-level output portion 551 does not output anything.

The high-level output portion 551 is controlled according to a voltage of the first node N1, and the voltage of the first node is controlled by the first node_first controller 553 and the first node_second controller 554.

The low-level output portion 552 is controlled according to a voltage of the second node N2, and the voltage of the second node N2 is controlled by the second node_first controller 555 and the second node_second controller 556. In FIG. 3, the second node_first controller 555 is divided into (or includes) a first second node_first controller 555-1 and a second second node_first controller 555-2.

The first node_second controller 554 is controlled by a voltage of the third node N3, and the voltage of the third node N3 is controlled by the third node controller 557.

In the light emitting signal stage EM of FIG. 3, like the odd-numbered light emitting signal stage EM of FIG. 2, a first clock signal wire 171 is connected to the first clock input terminal In1 and thus a first clock signal EM_CLK1 is applied, and a second clock signal wire 172 is connected to the second clock input terminal In2 and thus a second clock signal EM_CLK1 is applied. However, the even-numbered light emitting signal stage EM may be applied with clock signals that are opposite to those applied to the odd-numbered light emitting signal stage EM.

The details of each part are as follows.

The high-level output portion 551 includes a sixth transistor T6, and a control electrode of the sixth transistor T6 is connected with the first node N1, an input electrode of the sixth transistor T6 is connected with the terminal of the high voltage VGH, and an output electrode of the sixth transistor T6 is connected with the output terminal Out. Thus, when the voltage of the first node N1 is a low voltage, the high voltage VGH is output to the output terminal Out, and when the voltage of the first node N1 is a high voltage, the sixth transistor T6 outputs nothing.

The low-level output portion 552 includes a seventh transistor T7, and a control electrode of the seventh transistor T7 is connected with the second node N2, an input electrode of the seventh transistor T7 is connected with the terminal of the low voltage VGL, and an output electrode of the seventh transistor T7 is connected with the output terminal Out. Thus, when the voltage of the second node N2 is a low voltage, the low voltage VGL is output to the output terminal Out, and when the voltage of the second node N2 is a high voltage, the seventh transistor T7 outputs nothing (e.g., the low voltage VGL is not output to the output terminal Out).

The voltage of the first node N1 is controlled by the first node_first controller 553 and the first node_second controller 554.

The first node_first controller 553 includes one transistor (e.g., an eighth transistor T8) and one capacitor (e.g., a first capacitor C1). The control electrode of the eighth transistor T8 is connected to the second node N2, an input electrode of the eighth transistor T8 is connected to the terminal of the high voltage VGH, and an output electrode of the eighth transistor T8 is connected to the first node N1. Meanwhile, two electrodes of the first capacitor C1 are respectively connected to the input electrode and the output electrode of the eighth transistor T8, and thus the first capacitor C1 is connected between the first node N1 and the terminal of the high voltage VGH. The eighth transistor T8 transmits the high voltage VGH to the first node N1 when the voltage of the second node N2 is a low voltage, and the first capacitor C1 stores and maintains the voltage of the first node N1. That is, the first node_first controller 553 serves to change the voltage of the first node N1 to the high voltage VGH.

Meanwhile, the first node_second controller 554 includes two transistors (e.g., a ninth transistor T9 and a tenth transistor T10) and one capacitor (e.g., a second capacitor C2). A control electrode of the ninth transistor T9 is connected to the first clock input terminal In1, an output electrode of the ninth transistor T9 is connected to the first node N1, and an input electrode of the ninth transistor T9 is connected to the fourth node N4. A control electrode of the tenth transistor T10 is connected to the third node N3, an output electrode of the tenth transistor T10 is connected to the fourth node N4, and an input electrode of the tenth transistor T10 is connected to the first clock input terminal In1. Here, the input electrode and the output electrode may have opposite inputs and outputs depending on the magnitude of the connected voltage. The first node_second controller 554 serves to change the voltage of the first node N1 to a low voltage of a clock signal.

Meanwhile, the second capacitor C2 is connected between the third node N3 and the fourth node N4, and may boost up the voltage of the fourth node N4 by using a voltage difference between the two nodes N3 and N4.

The voltage of the second node N2 is controlled by the second node_first controller 555 and the second node_second controller 556.

The second node_first controller 555 is formed of a first second node_first controller 555-1 and a second second node_first controller 555-2, and the first second node_first controller 555-1 is formed of one transistor (e.g., a first transistor T1) and the second second node_first controller 555-2 is formed of one capacitor (e.g., a third capacitor C3). A control electrode of the first transistor T1 is connected to the second clock input terminal In2, an input electrode of the first transistor T1 is connected to the control terminal ACL_FLM, and an output electrode of the first transistor T1 is connected to the second node N2. One electrode of the third capacitor C3 is connected to the second node N2 and the other electrode is connected to the first clock input terminal In1.

Due to the structure of the third capacitor C3, the voltage of the second node N2 may also change due to the variable clock signal applied to the first clock input terminal In1. Thus, capacitance of the third capacitor C3 may be set to be a very high value so as to reduce fluctuation of the second node N2. Accordingly, a voltage of the other electrode of the third capacitor C3, that is, the voltage of the second node N2, is not greatly changed even though the clock signal applied to one electrode of the third capacitor C3 is changed. Due to the third capacitor C3, the capacitance of the first clock input terminal In1 has a very high value compared to the capacitance of the second clock input terminal In2.

The first transistor T1 included in the second node_first controller 555 changes the voltage of the second node N2 to a voltage of the control signal FLM or light emitting signal of the previous stage when the third clock signal EM_CLK3 applied to the second clock input terminal In2 has a low voltage, and the third capacitor C3 stores and maintains the same. That is, the second node_first controller 555 serves to change the voltage of the second node N2 to a high voltage or a low voltage according to a carry signal (e.g., the control signal FLM or the light emitting signal of the previous stage).

The second node_second controller 556 is formed of two transistors (e.g., a second transistor T2 and a third transistor T3). A control electrode of the second transistor T2 is connected to the third node N3, an input electrode of the second transistor T2 is connected to the terminal of the high voltage VGH, and an output electrode of the second transistor T2 is connected to an input electrode of the third transistor T3. A control electrode of the third transistor T3 is connected to the first clock input terminal In1, the input electrode of the third transistor T3 is connected to the output electrode of the second transistor T2, and an output electrode of the third transistor T3 is connected to the second node N2. That is, the second node_second controller 556 prevents or substantially prevents the high voltage VGH from being connected to the second node N2 such that the voltage of the second node N2 is not changed to the low voltage.

The third node controller 557 is formed of two transistors (e.g., a fourth transistor T4 and a fifth transistor T5). A control terminal of the fourth transistor T4 is connected to the second node N2, an input terminal of the fourth transistor T4 is connected to the second clock input terminal In2, and an output terminal of the fourth transistor T4 is connected to the third node N3. A control electrode of the fifth transistor T5 is connected to the second clock input terminal In2, an input terminal of the fifth transistor T5 is connected to the terminal of the low voltage VGL, and an output terminal of the fifth transistor T5 is connected to the third node N3. The fifth transistor T5 serves to make the voltage of the third node N3 the low voltage VGL, and the fourth transistor T4 makes the voltage of the third node N3 the voltage of the second clock input terminal In2 such that the voltage of the third node N3 is changed to a high voltage (e.g., a high voltage of a clock signal).

The light emitting signal stage EM having such a configuration is determined according to the signal applied to the first clock input terminal In1, the second clock input terminal In2, and the control terminal ACL_FLM, and this will be described in more detail with reference to FIG. 4.

Figure 4:
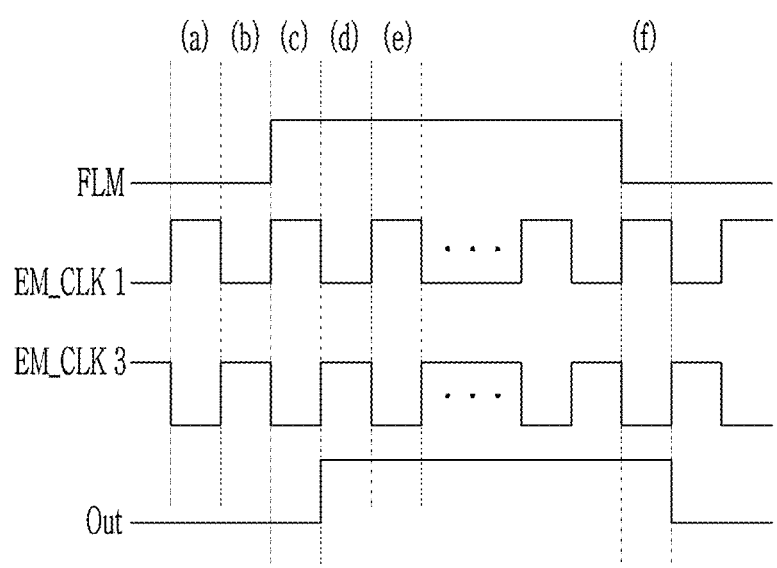
FIG. 4 is a waveform diagram of a signal applied to a stage and a light emitting signal according to the signal according to an exemplary embodiment.

FIG. 4 is a waveform diagram of a signal applied to a stage and a light emitting signal according to the signal according to an exemplary embodiment.

First, signals applied to a first clock input terminal In1, a second clock input terminal In2, and a control terminal ACL_FLM of a light emitting signal stage EM will be described in more detail with reference to FIG. 4.

In the present exemplary embodiment, a first clock signal EM_CLK1 is applied to the first clock input terminal In1 and a third clock signal EM_CLK3 is applied to the second clock input terminal In2. The first clock signal EM_CLK1 and third clock signal EM_CLK3 are clock signals that repeat high voltage and low voltage and have inversion characteristics to each other. For example, the first clock signal EM_CLK1 of a high voltage is applied when the third clock signal EM_CLK3 of a low voltage is applied, and the first clock signal EM_CLK1 of a low voltage is applied when the third clock signal EM_CLK3 of a high voltage is applied.

Meanwhile, a control signal FLM applied from the outside is transmitted as a carry signal to a control terminal ACL_FLM of the first light emitting signal stage EM[1,2], and an output signal of the previous light emitting signal stage, that is, a light emitting signal, is transmitted as a carry signal from the second light emitting signal stage EM[3,4]. The control signal FLM and the light emitting signal have one high-voltage section during one frame, and they are applied as low voltages in the remaining sections of the frame. A high-voltage section is a section during which a data voltage is applied to a pixel PX, and the pixel PX emits light in a low-voltage section (e.g., a light emission period).

In FIG. 4, a voltage applied to the light emitting signal stage is divided into (a), (b), (c), (d), (e), and (f) for each stage, and operation for each section is as follows.

First, operation of the light emitting signal stage EM in the section (a) will be described.

In the section (a), a low voltage is applied to the control signal FLM, a first clock signal EM_CLK1 of a high voltage is applied to the first clock input terminal In1, and a third clock signal EM_CLK3 of a low voltage is applied to the second clock input terminal In2. A third transistor T3 and a ninth transistor T9 are turned off due to the first clock signal EM_CLK1 of the high voltage, and a first transistor T1 and a fifth transistor T5 are turned on due to the third clock signal EM_CLK3 of the low voltage.

The control signal FLM of the low voltage is applied to the second node N2 through the first transistor T1 and thus the low voltage of the second node N2 is stored in a third capacitor C3. The seventh transistor T7 is turned on by the low voltage of the second node N2 and thus the low voltage VGL is output to the output terminal Out. In addition, the eighth transistor T8 is turned on due to the low voltage of the second node N2 and thus the first node N1 becomes the high voltage VGH, and opposite ends of the first capacitor C1 become the high voltage VGH. Accordingly, the sixth transistor T6 is turned off.

In addition, the fourth transistor T4 is turned on by the low voltage of the second node N2 and thus a low voltage value of the third clock signal EM_CLK3 is applied such that a voltage of the third node N3 is applied as a low voltage. In addition, the low voltage VGL is applied through the fifth transistor T5.

A tenth transistor T10 is turned on due to the low voltage VGL of the third node N3 and thus the first clock signal EM_CLK1 of a high voltage is applied to the fourth node N4. Thus, a high voltage (e.g., applied to the fourth node N4)

and a low voltage (e.g., applied to the third node N3) are applied to opposite ends of the capacitor C2.

In addition, the second transistor T2 is turned on due to the low voltage VGL of the third node N3, but the third transistor T3 is turned off and thus the high voltage VGH is not transmitted to the second node N2 and is transmitted only to the input electrode of the third transistor T3.

In summary, in the section (a), the first node N1 has a high voltage, the second node N2 has a low voltage, the third node N3 has a low voltage, the fourth node N4 has a high voltage, and as the main operation, the seventh transistor T7 is turned on by the low voltage of the second node N2 and thus the low voltage VGL is applied to the output terminal Out.

Hereinafter, operation of the light emitting signal stage in the section (b) will be described.

In the section (b), the control signal FLM is maintained without any change, the first clock signal EM_CLK1 is changed to the low voltage and then applied to the first clock input terminal In1, and the third clock signal EM_CLK3 is changed to the high voltage and then applied to the second clock input terminal In2. The third transistor T3 and the ninth transistor T9 are turned on by the first clock signal EM_CLK1 of the low voltage, and the first transistor T1 and the fifth transistor T5 are turned off by the third clock signal EM_CLK3 of the high voltage.

Because the first transistor T1 is in the turned-off state, the low voltage stored in the third capacitor C3 is maintained without any change such that the voltage of the second node N2 maintains the low voltage. Thus, the seventh transistor T7 continuously maintains the turned-on state such that the low voltage VGL is output to the output terminal Out.

In addition, the eighth transistor T8 is also turned on due to the low voltage of the second node N2 and thus the first node N1 becomes the high voltage VGH, the sixth transistor T6 maintains the turned-off state, and the opposite ends of the first capacitor C1 become the high voltage VGH.

In addition, the fourth transistor T4 is turned on due to the low voltage of the second node N2 and thus the third clock signal EM_CLK3 of the high voltage is applied to the third node N3 such that the voltage of the third node N3 is changed to a high voltage value. In this case, because the fifth transistor T5 is turned off, the third node N3 is changed to the high voltage due to the fourth transistor T4.

The tenth transistor T10 is changed to the turned-off state due to the high voltage of the third node N3, and the ninth transistor T9 is turned on due to the first clock signal EM_CLK1 of the low voltage such that the first node N1 and the fourth node N4 are connected to each other. In this case, the voltage of the third node N3 connected with the second capacitor C2 is changed to the high voltage from the low voltage, and thus the fourth node N4 and the voltage of the first node N1 connected to the fourth node N4 are boosted up (e.g., boosted up to a high voltage). Thus, the voltage of the first node N1 may have a voltage value that is higher than the high voltage VGH. Meanwhile, the second transistor T2 maintains the turned-off state due to the high voltage of the third node N3, and the third transistor T3 is turned on by the first clock signal EM_CLK1 of the low voltage.

In summary, in the section (b), the first node N1 and the fourth node N4 are applied with the boosted-up high voltage, the second node N2 is applied with the low voltage, and the third node N3 is applied with the high voltage, and as the main operation, the seventh transistor T7 is turned on due to the low voltage of the second node N2 such that the low voltage VGL is continuously applied to the output terminal Out.

Comparing the section (a) and the section (b), the clock signal is inverted and then applied, but the voltage of the first node N1 is maintained as the high voltage and the voltage of the second node N2 is maintained as the low voltage such that the low voltage VGL is continuously output to the output terminal Out.

Hereinafter, operation of the light emitting signal stage in the section (c) will be described.

In the section (c), the control signal FLM is changed to the high voltage, the first clock signal EM_CLK1 is changed to the high voltage and then applied to the first clock input terminal In1, and the third clock signal EM_CLK3 is changed to the low voltage and then applied to the second clock input terminal In2.

The third transistor T3 and the ninth transistor T9 are turned off due to the first clock signal EM_CLK1 of the high voltage, and the first transistor T1 and the fifth transistor T5 are turned on due to the third clock signal EM_CLK3 of the low voltage. The control signal FLM of the high voltage is applied to the second node N2 through the first transistor T1 and thus the voltage of the second node N2 is changed to the high voltage and then stored in the third capacitor C3. The seventh transistor T7 is turned off by the high voltage of the second node N2. In addition, the eighth transistor T8 and the ninth transistor T9 are turned off by the high voltage of the second node N2.

Meanwhile, because the fifth transistor T5 is turned on, the low voltage VGL is applied to the third node N3. In this case, the fourth transistor T4 is turned off because the second node N2 has the high voltage. Accordingly, the voltage of the third node N3 is controlled by the fifth transistor T5, and is changed to the low voltage VGL.

The second transistor T2 and the tenth transistor T10 are turned on by the low voltage of the third node N3. Because the tenth transistor T10 is turned on, the first clock signal EM_CLK1 of the high voltage is applied to the fourth node N4. Thus, the high voltage (e.g., applied to the fourth node N4) and the low voltage (e.g., applied to the third node N3) are applied to opposite ends of the second capacitor C2.

Because the ninth transistor T9 and the eighth transistor T8 are turned off, the voltage of the first node N1 maintains the high-voltage state by being maintained with the voltage in the section (b).

In summary, in the section (c), the first node N1 is applied with the high voltage, the second node N2 is applied with the high voltage, the third node N3 is applied with the low voltage, and the fourth node N4 is applied with the high voltage, and the seventh transistor T7 and the sixth transistor T6 are both in the turned-off state and thus may be floated without having a voltage output to the output terminal Out, and the low voltage VGL is output until the voltage of the second node N2 becomes a turn-off voltage of the seventh transistor T7, and then the seventh transistor T7 is turned off and thus floated.

Hereinafter, operation of light emitting signal stage in a section (d) will be described.

In the section (d), the control signal FLM maintains the high voltage, the first clock signal EM_CLK1 is changed to the low voltage and then applied to the first clock input terminal In1, and the third clock signal EM_CLK3 is changed to the high voltage and then applied to the second clock input terminal In2.

The third transistor T3 and the ninth transistor T9 are turned on by the first clock signal EM_CLK1 of the low voltage, and the first transistor T1 and the fifth transistor T5 are turned off by the third clock signal EM_CLK3 of the high voltage.

Because the first transistor T1 is in the turned-off state, the high voltage stored in the third capacitor C3 is maintained such that the voltage of the second node N2 has a high voltage value. Thus, the seventh transistor T7 maintains the turned-off state. In addition, the eighth transistor T8 and the fourth transistor T4 also maintain the turned-off state by the high voltage of the second node N2.

The fifth transistor T5 is turned off by the third clock signal EM_CLK3 of the high voltage. Because both of the fourth transistor T4 and the fifth transistor T5 are turned off, the voltage of the third node N3 is not changed and maintains the low voltage, which is the voltage of the third node N3 in the section (c).

The tenth transistor T10 maintains the turned-on state by the low voltage of the third node N3, and the ninth transistor T9 is turned on by the first clock signal EM_CLK1 of the low voltage such that the first node N1, the fourth node N4, and the first clock signal EM_CLK1 of the low voltage are connected with each other. Thus, the voltage of the first node N1 and the voltage of the fourth node N4 are changed to the low voltage. The sixth transistor T6 is turned on by the low voltage of the first node N1, and accordingly, the high voltage VGH is output to the output terminal Out.

Meanwhile, the second transistor T2 is turned on by the low voltage of the third node N3 and the third transistor T3 is also turned on by the first clock signal EM_CLK1 of the low voltage, and thus the terminal of the high voltage VGH is connected with the second node N2. Thus, the voltage of the second node N2 is maintained with the high voltage VGH and the seventh transistor T7 cannot be turned on.

In summary, in the section (d), the first node N1 and the fourth node N4 are applied with the low voltage, the second node N2 is applied with the high voltage, and the third node N3 is applied with the low voltage, and as the main operation, the sixth transistor T6 is turned on by the low voltage of the first node N1 such that the high voltage VGH starts to be output to the output terminal Out. Pixels PX applied with a light emitting signal of the high voltage VGH may be in the writing period during which a data voltage is stored in a capacitor of the pixel PX.

Hereinafter, operation of the light emitting signal stage in the section (e) will be described.

In the section (e), the control signal FLM is maintained as the high voltage, the first clock signal EM_CLK1 is changed to the high voltage and then applied to the first clock input terminal In1, and the third clock signal EM_CLK3 is changed to the low voltage and then applied to the second clock input terminal In2.

The third transistor T3 and the ninth transistor T9 are turned off due to the high voltage of the first clock signal EM_CLK1, and the first transistor T1 and the fifth transistor T5 are turned on due to the third clock signal EM_CLK3 of the low voltage.

A control signal of a high voltage is applied to the second node N2 through the first transistor T1 and thus the voltage of the second node N2 is maintained as the high voltage. The seventh transistor T7 is turned off due to the high voltage of the second node N2. In addition, the eighth transistor T8 and the fourth transistor T4 also maintain the turned-off state due to the high voltage of the second node N2.

The fifth transistor T5 is turned on and thus the low voltage VGL is applied to the third node N3. In this case, the fourth transistor T4 is turned off and thus the fourth transistor T4 cannot change the voltage of the third node N3.

Because the third node N3 has the low voltage VGL, the second transistor T2 and the tenth transistor T10 are turned on. The tenth transistor T10 is turned on and thus the fourth node N4 is applied with the first clock signal EM_CLK1 of the high voltage. Thus, the high voltage (e.g., applied to the fourth node N4) and the low voltage (e.g., applied to the third node N3) are applied to opposite ends of the second capacitor C2.

In addition, the second transistor T2 is turned on and the third transistor T3 is turned off, and thus the high voltage VGH is transmitted only to the input electrode of the third transistor T3 and is not transmitted to the second node N2.

Because the ninth transistor T9 is turned off due to the first clock signal EM_CLK1 of the high voltage, the voltage stored in the first capacitor C1 is not changed and the voltage of the first node N1 is maintained as the low voltage. Thus, the sixth transistor T6 is turned on such that the high voltage VGH is continuously output to the output terminal Out.

In summary, in the section (e), the first node N1 is applied with the low voltage, the second node N2 is applied with the high voltage, the third node N3 is applied with the low voltage, and the fourth node N4 is applied with the high voltage, and the sixth transistor T6 maintains the turned-on state such that the high voltage VGH is continuously output to the output terminal Out.

Comparing the section (d) and the section (e), the clock signal is inverted and then applied, but the voltage of the first node N1 is maintained as the low voltage and thus the high voltage VGH is continuously output to the output terminal Out. In addition, the voltage of the second node N2 is maintained as the high voltage, and thus the low voltage VGL is not transmitted to the output terminal Out.

The section (d) and the section (e) are repeated several times, and then the section (f) starts as the control signal FLM is changed to the low voltage. The section (f) starts after a section having the same state as the section (d).

Hereinafter, operation of the light emitting stage in the section (f) will be described.

In the section (f), the control signal FLM is changed to the low voltage, the first clock signal EM_CLK1 is changed to the high voltage and then applied to the first clock input terminal In1, and the third clock signal EM_CLK3 is changed to the low voltage and then applied to the second clock input terminal In2.

The third transistor T3 and the ninth transistor T9 are turned off due to the high voltage of the first clock signal EM_CLK1, and the first transistor T1 and the fifth transistor T5 are turned on due to the low voltage of the third clock signal EM_CLK3.

The control signal of the low voltage is applied to the second node N2 through the first transistor T1 and thus the voltage of the second node N2 is changed to the low voltage, and the tenth transistor T10 is turned on. Thus, the low voltage VGL starts to be output to the output terminal Out. The eighth transistor T8 and the fourth transistor T4 also have the turned-on state due to the low voltage of the second node N2.

Because the eighth transistor T8 is turned on, the high voltage VGH is applied to the first node N1, and the sixth transistor T6 is turned off due to the high voltage of the first node N1 and thus the high voltage VGH is no longer output to the output terminal Out.

As then fourth transistor T4 is turned on, the third clock signal EM_CLK3 of the low voltage is applied to the third node N3. In addition, the low voltage VGL is applied to the third node N3 through the turned-on fifth transistor T5. Accordingly, the third node N3 has a low voltage.

The second transistor T2 and the tenth transistor T10 are turned on by the low voltage of the third node N3. The tenth transistor T10 is turned on and thus the first clock signal EM_CLK1 of the high voltage is applied to the fourth node N4. Thus, the high voltage (e.g., applied to the fourth node N4) and the low voltage (e.g., applied to the third node N3) are applied to the opposite ends of the second capacitor C2.

In addition, the second transistor T2 is turned on but the third transistor T3 is turned off, and thus the high voltage VGH is transmitted only to the input electrode of the third transistor T3 and the high voltage VGH is not transmitted to the second node N2.

Because the ninth transistor T9 is turned off due to the high voltage of the first clock signal EM_CLK1, the voltage of the first node N1 is not affected. Thus, the voltage of the first node N1 is controlled by the eighth transistor T8, and the high voltage VGH is transmitted through the eighth transistor T8 and thus the voltage of the first node N1 maintains the high voltage.

In summary, in the section (f), the first node N1 is applied with the high voltage, the second node N2 is applied with the low voltage, the third node N3 is applied with the low voltage, and the fourth node N4 is applied with the high voltage, and the sixth transistor T6 is turned off and the seventh transistor T7 is turned on and thus the voltage of the output terminal Out is changed to the low voltage VGL from the high voltage VGH and then output.

The section (f) is followed by a section corresponding to the section (b), and after that, operation is repeated as described above.

Thus, the light emitting signal stage outputs a light emitting signal that is delayed by a half clock period from the control signal. That is, because the carry signal applied to the light emitting signal stage of the next stage is delayed by half clock periods, the application timing of the high voltage VGH among the output light emitting signals is also sequentially output by delaying by half clock periods.

Hereinafter, referring to FIG. 5 and FIG. 6, characteristics of each transistor included in a stage according to a comparative example will be described.

First, referring to FIG. 5, characteristics of each transistor included in a stage of a light emitting driver according to a comparative example will be described.

Figure 5:
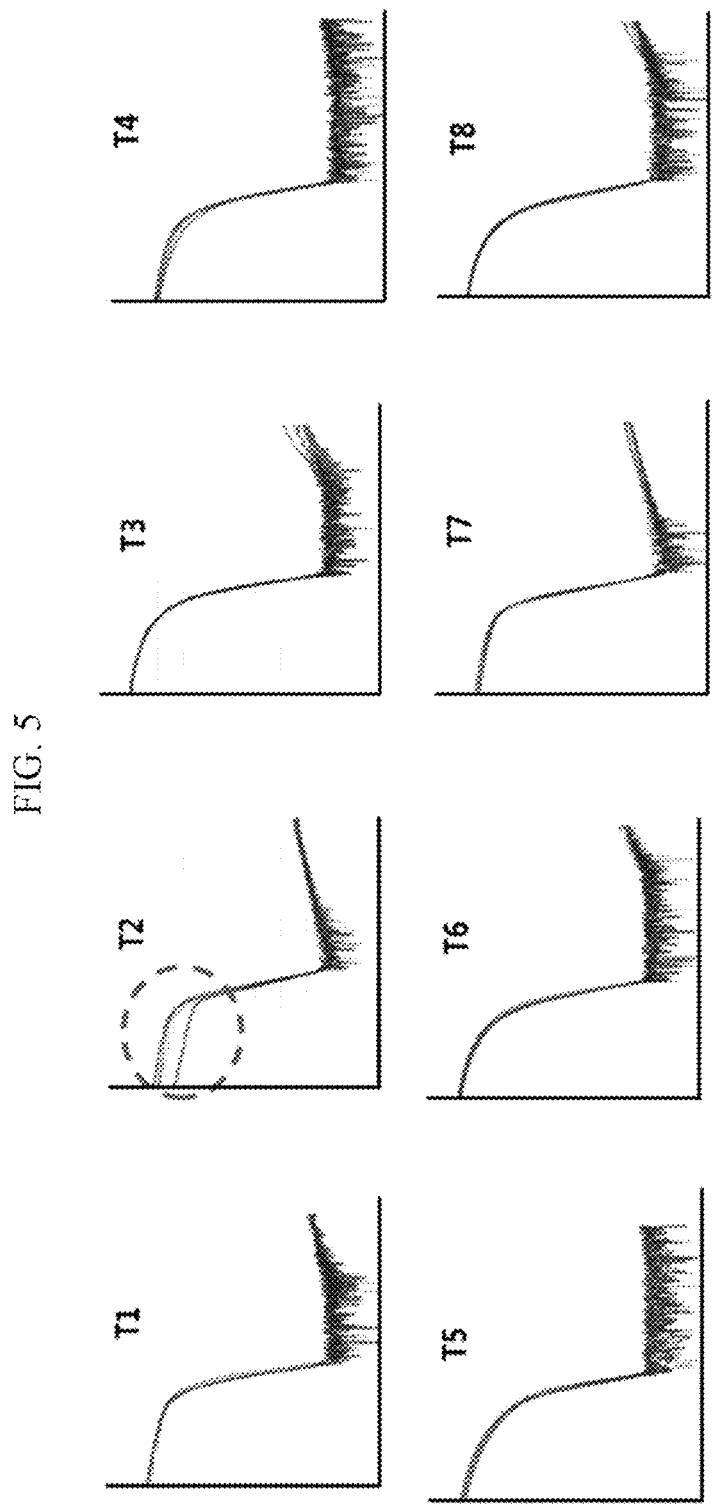
FIG. 5 shows graphs of simulation results of characteristics of each transistor included in a stage of a light emitting driver according to a comparative example.

FIG. 5 shows graphs of simulation results of characteristics of each transistor included in a stage of a light emitting driver according to a comparative example.

In the graphs of FIG. 5, the x-axis denotes a Vgs value and the y-axis denotes an Ids value.

It can be determined that transistors included in a stage of a light emitting driver according to a comparative example mostly maintain constant output currents, but a second transistor T2 outputs a reduced output current.

Figure 6:
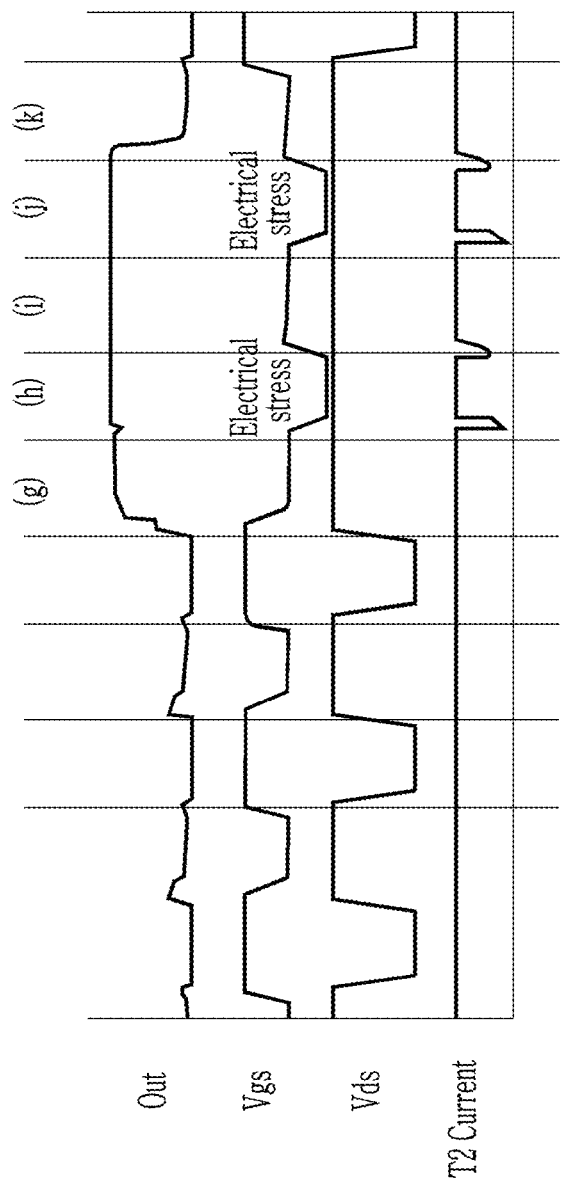
FIG. 6 is a waveform diagram showing the characteristics of the second transistor T2 in the stage according to the comparative example.

In order to determine a cause of the decrease in the output current of the second transistor T2, characteristics of the second transistor T2 according to the comparative example were simulated, and the simulation results are shown in FIG. 6.

FIG. 6 is a waveform diagram showing the characteristics of the second transistor T2 in the stage according to the comparative example.

In FIG. 6, Vgs, Vds, and an output current (e.g., current of T2) are illustrated to determine a voltage and an output current in the second transistor T2 included in the stage of the light emitting driver according to the comparative example, and a light emitting signal output from an output terminal Out of the corresponding stage is additionally illustrated. The output current shown in FIG. 6 shows only the change in intensity regardless of the direction.

Referring to FIG. 3, Vgs in the second transistor T2 has a value obtained by subtracting the high voltage VGH from the voltage of the third node N3, and Vds has a value obtained by subtracting the high voltage VGH from a voltage of a node where the third transistor T3 and the second transistor T2 are connected (e.g., a node between the third transistor T3 and the second transistor T2).

In FIG. 6, the section (g) and the section (i) correspond to the section (d) in FIG. 4, the section (h) and the section (j) correspond to the section (e) of FIG. 4, and the section (k) corresponds to the section (f) of FIG. 4.

As described above with reference to FIG. 4, the third node N3 is applied with the low voltage in the sections (d), (e), and (f), but a level of the low voltage swings due to the clock signal at the periphery thereof. Thus, Vgs and Vds shown in FIG. 6 also have voltage levels that swing.

In particular, in the sections (h) and (j) of FIG. 6, a portion where electrical stress is applied as the Vgs value of the second transistor T2 is further lowered and a strong electric field is generated.

In FIG. 6, it is shown that the current of the second transistor T2 is changed before and after the section (h) and the section (j) where the Vgs value of the second transistor T2 becomes lower. That is, when the Vgs value of the second transistor T2 is further lowered and when the Vgs value is increased again, the output current is changed. It is illustrated in FIG. 6, that the output current value is more greatly changed when the Vgs value of the second transistor T2 is further lowered.

Such a change in the current of the second transistor T2 occurs four times in each writing period, and occurs repeatedly in each writing period, and thus, as shown in FIG. 5, the output current of the second transistor T2 is reduced as a whole while the stress increases in long-time use.

The decrease of the output current of the second transistor T2 may cause a problem for the light emitting driver to provide a constant output.

As described, in FIG. 6, it was confirmed that the output current of the second transistor T2 was reduced by electrical stress.

However, in case of the flexible display device, mechanical stress also exists when a channel layer is folded while folding or unfolding the display device or maintaining the folded state. Therefore, the characteristic of the transistor may be changed while electrons or holes are positioned at a specific position of a semiconductor layer due to mechanical stress. Thus, it may be desirable to take into account a reduction in the output current of the transistor due to the mechanical stress.

Therefore, in the present disclosure, it is determined that a sudden change in the output current in at least one transistor included in the light emitting driver occurs due to at least one of a characteristic change in a semiconductor layer by a compressive force generated when folding in the flexible display device (hereinafter referred to as mechanical stress) and a characteristic change of the transistor (hereinafter referred to as electrical stress) caused by the accumulation of hot carriers due to the high horizontal electric field in the channel of the transistor.

Figure 7:
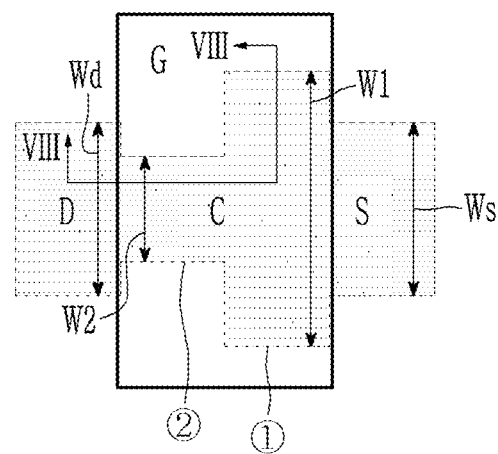
FIG. 7 is a top plan view of an asymmetric structure of a transistor according to an exemplary embodiment.
Figure 8:
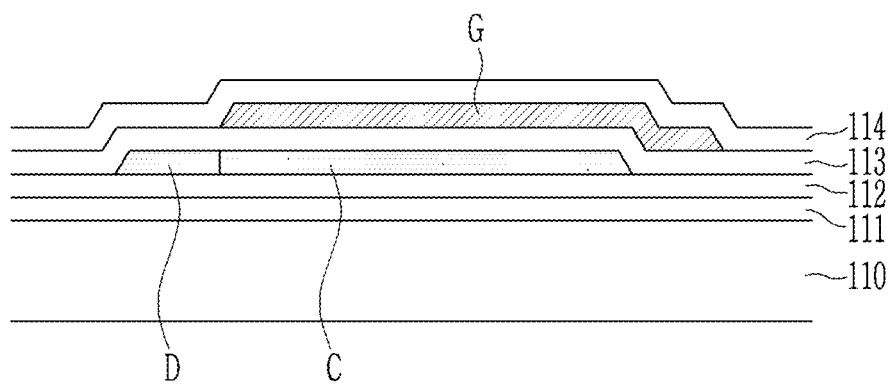
FIG. 8 is a cross-sectional view of FIG. 7, taken along the line VIII-VIII.

As described, in order to overcome the output current problem in the transistor due to the mechanical stress or electrical stress, a transistor including an asymmetric channel structure as shown in FIG. 7 and FIG. 8 is included according to an exemplary embodiment.

FIG. 7 is a top plan view of an asymmetric structure of a transistor according to an exemplary embodiment, and FIG. 8 is a cross-sectional view of FIG. 7, taken along the line VIII-VIII.

In FIG. 7 and FIG. 8, only a structure of a transistor is illustrated, and a semiconductor layer formed of a polycrystalline semiconductor and including a drain region D, a source region S, and a channel region C, and a gate electrode G overlapping the channel region C, are illustrated. A gate insulation layer 113 (as shown in FIG. 8) is disposed between the semiconductor layer and the gate electrode G.

First, a planar structure of an asymmetric channel structure in which a channel width is non-uniform in the channel region C will be described in more detail with reference to FIG. 7.

In the semiconductor layer of the transistor according to the exemplary embodiment, the source region S and the drain region D have about the same or the same width (Ws=Wd), but the channel region C has a width that is different from the width of the source region S and the width of the drain region D. In addition, in the channel region C, a channel width W1 of a first region ① that contacts the source region S is wider (i.e., greater) than a channel width W2 of a second region ② that contacts the drain region D.

The channel width W1 of the first region ① is wider than widths Ws and Wd of the source region S and the drain region D, and the channel width W2 of the second region ② is narrower (i.e., less) than the widths Ws and Wd of the source region S and the drain region D. In the exemplary embodiment of FIG. 7, the first region ① and the second region ② are connected (e.g., directly connected) to each other such that a channel width at the periphery of the center of the channel region C is suddenly changed. For example, the channel region may include a first region ① and a second region ② that are directly connected to each other such that the first region ① and the second region ② form a T-shape. However, depending on exemplary embodiments, a middle region between the first region and the second region may be further included at the periphery of the center of the channel region C, and the middle region may have a channel width (i.e., a middle channel width) that is between the channel width of the first region and the channel width of the second region or a gradually changing channel width (e.g., a channel width that gradually changes from the channel width W1 of the first region ① to the channel width W2 of a second region ②).

In the semiconductor layer, the channel region C is a polycrystalline semiconductor layer that overlaps the gate electrode G on the plane or in a plan view and may not be doped with an impurity, and the source region S and the drain region D are polycrystalline layers and may have the same characteristic as a conductor or have increased conductivity by being doped (e.g., highly doped) with an impurity.

In the exemplary embodiment of FIG. 7, the semiconductor layer extends in a horizontal direction (e.g., a first direction) at a portion where the transistor is located, and the gate electrode G extends in a vertical direction (e.g., a second direction) that crosses the first direction at the portion where the transistor is located.

Hereinafter, a cross-sectional view of a structure of a transistor will be described in more detail with reference to FIG. 8.

The flexible display device according to the exemplary embodiment includes a flexible substrate 110 formed of a flexible material such as a film or a polyimide (PI) and the like.

A barrier layer 111 and a buffer layer 112 may be disposed on the flexible substrate 110. The barrier layer 111 and the buffer layer 112 may include an inorganic insulation material such as a silicon oxide, a silicon nitride, an aluminum oxide, and the like, and depending on exemplary embodiments, they may include an organic insulation material such as a polyimide, a polyacryl (epoxy added), and the like. The barrier layer 111 and the buffer layer 112 serve to prevent or substantially prevent an impurity from being provided to the semiconductor layer from the flexible substrate 110 when crystallizing the subsequently formed semiconductor layer.

The semiconductor layer includes a non-doped channel region C, a source region S, and a drain region D. The source region S and the drain region D are doped at opposite sides of the channel region C. In FIG. 8, the source region S is not shown because the line VIII-VIII does not cross the source region S as shown in FIG. 7. The semiconductor layer is formed of a polycrystalline semiconductor, and after laminating amorphous silicon, the semiconductor layer is formed into a polycrystalline structure through a crystallization process. A doping process may be performed after a gate electrode G is formed.

A gate insulation layer 113 is formed on the semiconductor layer, and the gate electrode G is formed on the gate insulation layer 113. In FIG. 8, the gate insulation layer 113 wholly covers the semiconductor layer, but depending on exemplary embodiments, the gate insulation layer 113 may have the same width as the gate electrode G. When the gate insulation layer 113 and the gate electrode G have the same width, the drain region D and the source region S of the semiconductor layer are covered by an upper insulation layer 114. In one or more embodiments, the gate insulation layer 113 may cover the channel region C of the semiconductor layer but not the drain region D and the source region S of the semiconductor layer. The gate insulation layer 113 may include inorganic insulating materials such as a silicon oxide, a silicon nitride, and/or an aluminum oxide.

When the semiconductor layer is doped by using the gate electrode G as a mask, the channel region C is formed in a portion of the semiconductor, overlapping the gate electrode G in the thickness direction (e.g., a third direction perpendicular to the first direction and the second direction) or in a plan view and thus is not doped, and the doped source region S and the doped drain region D are disposed at opposite sides of the channel region C.

The upper insulation layer 114 is disposed on the gate electrode G and the gate insulation layer 113 while covering the same. The upper insulation layer 114 may include inorganic insulating materials such as a silicon oxide, a silicon nitride, and/or an aluminum oxide.

Additional wiring and an insulation layer may be formed on the upper insulation layer 114. As a representative structure, a source electrode and a drain electrode that are connected (e.g., electrically connected) to the source region S and the drain region D may be included, and a light emitting diode may also be formed in the display area 300.

In the present exemplary embodiment, the transistor having the structure of FIG. 7 and FIG. 8 is formed as the second transistor T2 included in the stage of the light emitting driver to prevent or substantially prevent the output current from being decreased due to electrical stress and mechanical stress.

Specifically, features of the transistor according to the exemplary embodiment of FIG. 7 and FIG. 8 will be described in more detail with reference to FIGS. 9-14.

Hereinafter, the structural features shown in FIG. 7 and FIG. 8 are compared with a comparative example of FIG. 9 to describe features of the structure of FIG. 7 and FIG. 8 that are improved in terms of electrical stress and mechanical stress.

Figure 9:
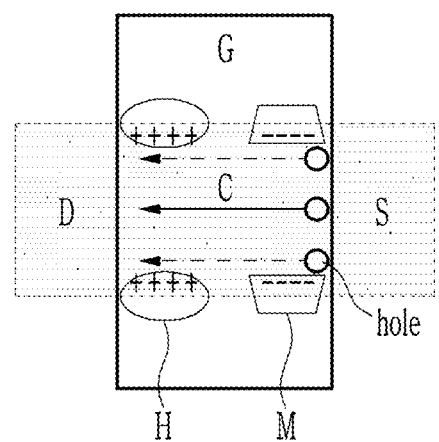
FIG. 9 is a top plan view of a transistor according to a comparative example and FIG. 10 is a top plan view of an asymmetric structure of a transistor according to an exemplary embodiment to describe whether or not the output current generated from the transistor of the exemplary embodiment of FIG. 7 is reduced.
Figure 10:
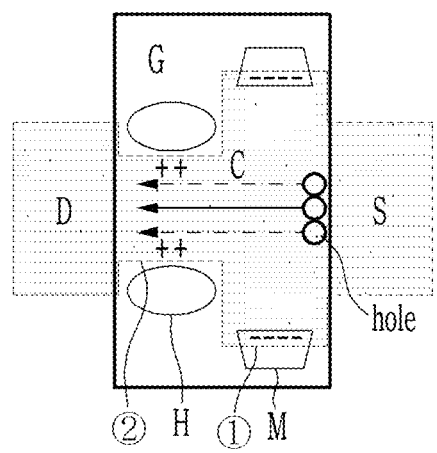

FIG. 9 and FIG. 10 are provided to describe whether or not the output current generated from the transistor of the exemplary embodiment of FIG. 7 is reduced.

FIG. 9 illustrates a structure including a semiconductor layer that has a constant width according to a comparative example. FIG. 10 illustrates an asymmetric channel structure like the planar structure of FIG. 7.

In FIG. 9 and FIG. 10, a trapping area where holes are collected is illustrated as H, and a trapping area where electrons are collected is illustrated as M.

Here, the trapping area H where holes are collected is adjacent to the drain region D, and the amount of collected holes is increased as the size of a lateral electrical field (e.g., refer to FIG. 12) is increased. The more electrical stresses are accumulated, the more holes are collected. In addition, the trapping area H where the holes are collected also has a feature that, structurally, as boundaries of the semiconductor layer or boundaries of the semiconductor layer are increased, the electric field in the horizontal direction is dispersed and reduced.

The portions marked by H in FIG. 9 and FIG. 10 indicate portions having the largest electric field in the horizontal direction, and where the holes can be converged the most. Comparing FIG. 9 and FIG. 10, even though it is a portion where the holes are most converged, in the case of FIG. 10, there are many boundaries of the semiconductor layer around and thus the lateral electric field (E-field) in the horizontal direction is dispersed and the degree of collecting is decreased.

Figure 11:
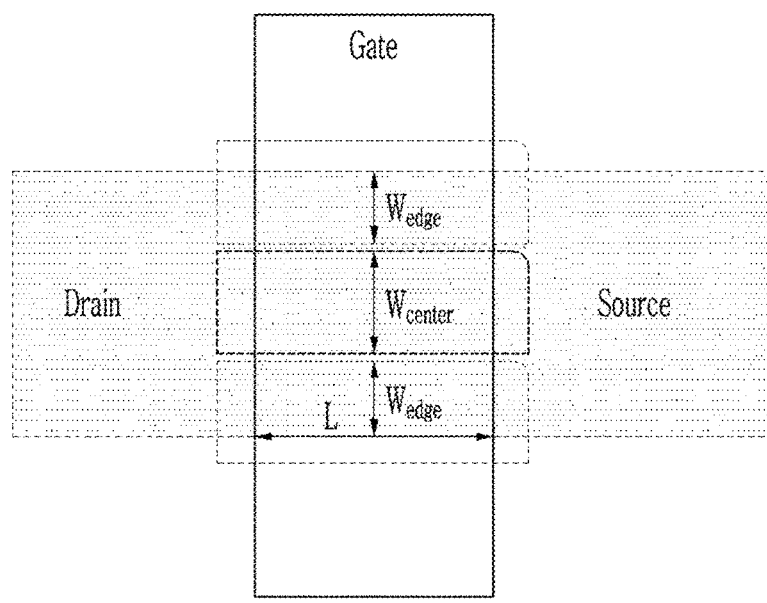
FIGS. 11-13 show features generated from an edge portion of the channel of the transistor.
Figure 12:
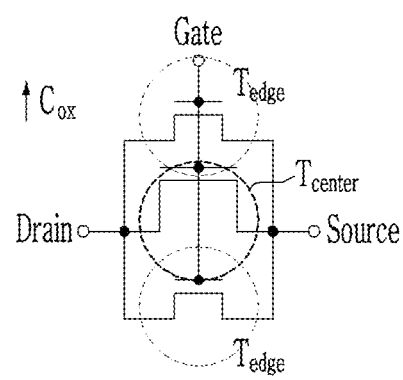
Figure 13:
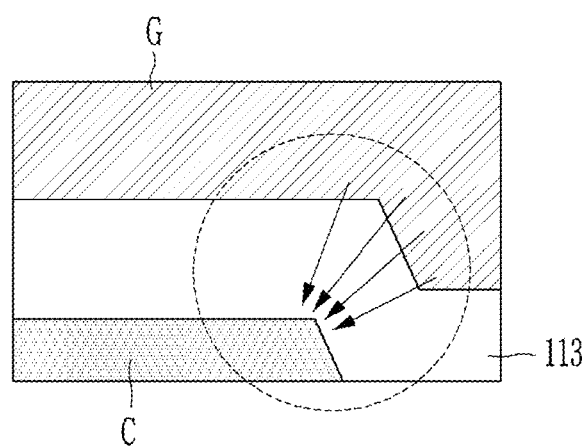

In order to confirm the phenomenon in which holes are collected according to the lateral electric field (E-field) in the horizontal direction, features of the lateral E-field in the horizontal direction are examined with reference to FIGS. 11-13.

FIGS. 11-13 show features generated from an edge portion of the channel of the transistor.

In FIG. 11 and FIG. 12, a channel of one transistor is divided into two types of channels. One is a channel edge $W_{edge}$ disposed at opposite edges in a width direction, and the other is a channel center $W_{center}$ corresponding to the center of the channel. The channel edge $W_{edge}$ is formed in two portions respectively disposed at opposite sides of the channel, while the channel center $W_{center}$ is disposed in a portion between the two portions, and thus the channel is divided into a total of three portions. A width of the entire channel may be the same as the sum of two times the width of the channel edge $W_{edge}$ and the width of the channel center $W_{center}$.

In FIG. 11, the channel edge $W_{edge}$ and the channel $W_{center}$ are divided in the planar view of the semiconductor layer, and FIG. 12 illustrates such a division as a circuit diagram.

In FIG. 12, a transistor corresponding to the channel center $W_{center}$ is illustrated as $T_{center}$ and a transistor corresponding to the channel edge $W_{edge}$ is illustrated as $T_{edge}$.

The electric field characteristic at the edge portion among these three distinct portions is shown in FIG. 13.

In FIG. 13, the channel region C of the semiconductor layer, the gate insulation layer 113, and the gate electrode G are enlarged.

Because the gate electrode G is formed while covering the side of the channel region C, as shown by the arrows in FIG. 13, an electric field having a component in a horizontal direction is generated, and holes are collected by a strong electric field in the edge portion of channel region C.

In the comparative example of FIG. 9, edges adjacent to the trapping area H where the holes are collected includes an edge of an upper or lower edge of the semiconductor layer and only one edge extending in the vertical direction (e.g., the second direction) of the gate electrode G. On the contrary, in the exemplary embodiment of FIG. 10, edges adjacent to the trapping portion H where the holes are collected includes further edges in the vertical direction (e.g., the second direction) of the drain region D and edges in the vertical direction (e.g., the second direction) of the first region ① of the channel region, in addition to the edge described in FIG. 9. Thus, the electric field in the horizontal direction is dispersed and the number of holes collected at the portion H is decreased. Accordingly, compared to the comparative examples, in the exemplary embodiment of FIG. 7, the decrease of the output current caused by the portion H where the holes are collected is mitigated.

The trapping portions M where the electrons are collected will now be described in more detail referring back to FIG. 9 and FIG. 10. The trapping area M where the electrons are collected is adjacent to the source region S, and the electrons tend to be collected at an outer edge or a boundary portion of the first region ① in the channel region C of the semiconductor layer. In particular, when the channel region is partially bent while the flexible display device is folded, accumulation of electrons at the corresponding position may be more increased. Thus, the trapping portion M where the electrons are collected is related to the mechanical stress, and more electrons (e.g., many more electrons) are accumulated in a portion having strong mechanical stress.

Referring to FIG. 9, the trapping portion where the electrons are collected occupies a part of a relatively narrow channel width, and decreases the output current while reducing an area where holes flow in the channel region C together with the trapping portion H where holes are collected.

On the contrary, in FIG. 10 that corresponds to the structure of FIG. 7, which is the present exemplary embodiment, the trapping portion M where electrons are collected in the first region ① is positioned at an edge and thus is located away from the area where the holes actually flow, and accordingly, the influence of the trapping portion M where electrons are collected on the decrease of the output current is reduced. Such a reduction of the influence does not decrease the output current due to a distance even when concentration of electrons in the trapping portion M where electrons are collected is increased as the flexible display device is folded.

As described, the asymmetric channel structure according to the exemplary embodiment of FIG. 7 prevents or substantially prevents the output current from decreasing due to electrical stress and mechanical stress.

Meanwhile, in case of a transistor having the structure of the comparative example of FIG. 9, an additional comparative example in which a length or a width of a channel is increased to prevent or reduce the decrease of the output current may be provided. In case of a transistor of such an additional comparative example, the electric field in the horizontal direction is positioned away from the center of the channel region by increasing the length or width of the channel, and accordingly, the overall influence of the channel is reduced, which may have the effect of preventing or substantially preventing the output current from being reduced to some extent. However, when the length or width of the channel is increased as in the additional comparative example, in an exemplary embodiment where the area of a high resolution display device or a non-display area is not large, the channel having an increased length or width may be difficult to form (e.g., due to size constraints).

In addition, in the following description, a decrease of an output current of an additional comparative example in which a width of a channel is increased, while having the structure of FIG. 9, is greater than a decrease of an output current of an exemplary embodiment in which the channel width is not increased, while having the asymmetric channel structure of FIG. 7, when stress is accumulated due to long period of use, as can be seen through a simulation result of FIG. 14.

Figure 14:
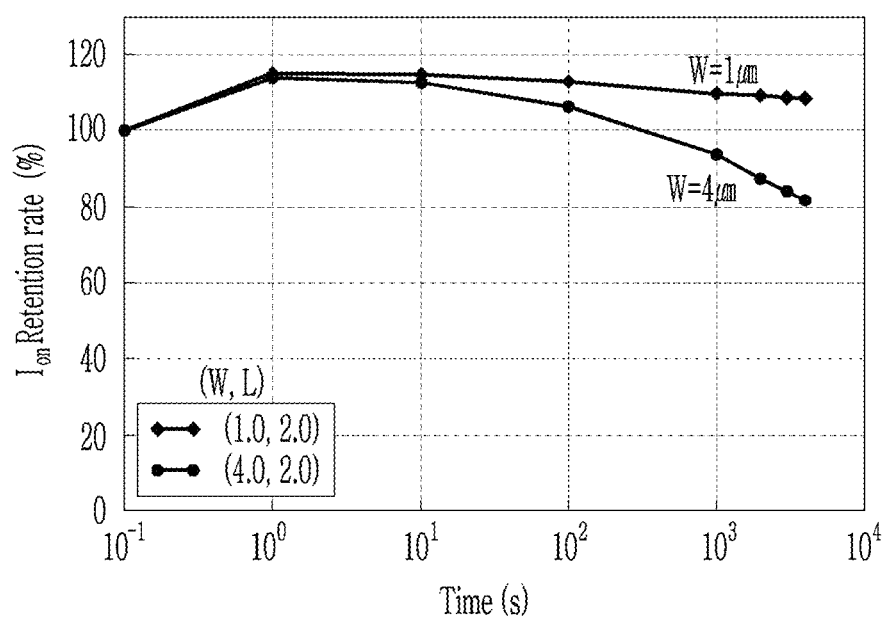
FIG. 14 is a graph that shows a simulation result of a change in the output current according to FIG. 9 and FIG. 10.

FIG. 14 is a graph that shows a simulation result of a change in the output current according to FIG. 9 and FIG. 10.

The graph of FIG. 14 shows a retention rate of the output current over time and the output current retention rate of two objects.

One is a transistor of which a channel width W is 4.0 μm and a length L is 2.0 μm while having the channel structure of FIG. 9, as an additional comparative example. The other is a transistor of which a channel width W is 1.0 μm and a length L is 2.0 μm while having the asymmetric channel structure of FIG. 7 without an increase of the channel width. Although specific widths and lengths are provided with respect to the asymmetric channel structure according to one or more embodiments, the present disclosure is not limited thereto. In other embodiments, an asymmetric channel structure may be provided with any suitable length and/or width.

As shown in the graph of FIG. 14, when the channel width W is increased as in the additional comparative example, the output current is not decreased for a constant period of time, but the output current suddenly decreases as the stress increases as it is used for a long time. However, it can be determined that a transistor having an asymmetric channel structure can be formed in a smaller area by not increasing the channel width, and the output current is maintained even when used for a long time.

As described, when the transistor having the asymmetric channel structure of FIG. 7 is used in the flexible display device that uses a polycrystalline semiconductor, it may keep the output current constant even when strong electrical stress or mechanical stress is applied.

In the above, the second transistor T2 in the stage of the light emitting driver among the flexible display devices has been described while focusing on the changes to the asymmetric channel structure shown in FIG. 7.

However, all the transistors formed on the flexible display device are forced to undergo mechanical stress due to the folding and unfolding operation and in a folded state.

The mechanical stress may cause more electrical stress, and particularly, a transistor positioned close to an input terminal to which a periodically applied clock signal is input may receive stronger electrical stress.

Thus, the asymmetric channel structure may be applied to the first transistor T1, the third transistor T3, the fourth transistor T4, the ninth transistor T9, or the tenth transistor T10 in addition to the second transistor T2 in the stages of the light emitting driver. In addition, transistors included in the high-level output portion 551, the first node_second controller 554, the second node_second controller 556, and the third node controller 557 may adopt the asymmetric channel structure.

Further, transistors positioned in other drivers of the flexible display device may have the asymmetric channel structure. In particular, the scan driver receives a clock signal like the light emitting driver, and receives a previous stage scan signal as a carry signal such that the output current may be decreased due to some transistors. Therefore, some of the transistors included in the scan driver may be formed with the asymmetric channel structure.

As described above, transistors included in the driver have a common point that electrical stress is strong. However, depending on exemplary embodiments, a transistor located at a portion where the flexible display device is folded may cause a decrease of the output current due to mechanical stress, and thus the asymmetric channel structure may be applied to various transistors (e.g., transistors included in pixels or other drivers) in addition to the above-described transistor of the driver to prevent or reduce the decrease of the output current due to mechanical stress.

Hereinafter, various deformation structures of an asymmetric channel structure will be described.

FIGS. 15-19 are top plan views of an asymmetric transistor structure according to another exemplary embodiment.

For reference, cross-sectional views of structures of FIGS. 15-19 are the same as or substantially similar to the cross-sectional view of the structure of FIG. 8, and thus duplicate descriptions thereof are not included.

First, an asymmetric channel structure of FIG. 15 will be described.

Figure 15:
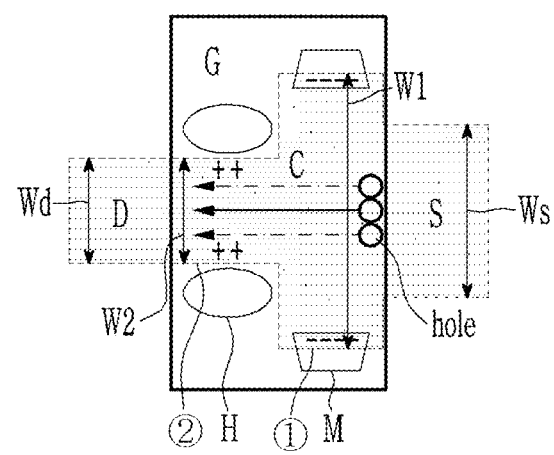
FIGS. 15-19 are top plan views of an asymmetric transistor structure according to another exemplary embodiment.

Unlike the exemplary embodiment of FIG. 7, in the exemplary embodiment of FIG. 15, a width Wd of a drain region D located in a semiconductor layer is narrower than a width Ws of a source region S. The width Wd of the drain region D is the same as a channel width W2 of a second region ② of a channel region C.

That is, in the semiconductor layer of the transistor according to the exemplary embodiment of FIG. 15, the source region S has a larger width than the drain region D (Ws>Wd), the width Wd of the drain region D is the same as the channel width W2 of the second region ② of the channel region C, and a channel width W1 of a first region ① that contacts the source region S of the channel region C has the largest width as shown in FIG. 15.

The channel width W1 of the first region ① is wider than the widths Ws and Wd of the source region S and the drain region D, and the channel width W2 of the second region ②. The channel width W2 of the second region ② is narrower than the width Ws of the source region S, while having the same width as the width Wd of the drain region D. In the exemplary embodiment of FIG. 15, the first region ① and the second region ② are connected (e.g., directly connected) and thus a channel width is suddenly changed near the center of the channel region C. However, depending on exemplary embodiments, a middle area (i.e., a middle region) may be further included between the first region and the second region near the center of the channel region C, and the middle area may have a channel width (i.e., a middle channel width) that is between the channel width of the first region and the channel width of the second region or may have a channel width that gradually changes (e.g., a channel width that gradually changes from the channel width W1 of the first region ① to the channel width W2 of a second region ②).

In the exemplary embodiment of FIG. 15, the semiconductor layer extends in a horizontal direction (e.g., the first direction) at a portion where the transistor is located, and a gate electrode G extends in a vertical direction (e.g., the second direction) that crosses the horizontal direction at the portion where the transistor is located. In addition, the semiconductor layer according to the exemplary embodiment of FIG. 15 is formed as a polycrystalline semiconductor layer, the channel region C overlaps the gate electrode G on a plane or in a plan view and thus is not doped with an impurity, and the source region S and the drain region D are polycrystalline semiconductor layers and are doped with an impurity at a high concentration and thus they may have the same characteristic as a conductor or have increased conductivity.

As shown in FIG. 7, in the asymmetric channel structure of FIG. 15, a portion M where electrons are collected in the first region ① is located at an edge, which is away from an area where holes actually flow, and thus the effect of the portion M where the electrons are collected on the decrease of the output current is reduced. Therefore, the decrease of the output current due to mechanical stress is mitigated.

Meanwhile, compared to the structure of FIG. 7, the number of edges that are adjacent to a portion H where holes are collected is reduced by one in the asymmetric channel structure of FIG. 15. That is, in the exemplary embodiment of FIG. 15, the drain region D and the second region ② have the same width and thus there is no edge in the vertical direction (e.g., the second direction) in the drain region D compared to the structure of FIG. 7. However, compared to FIG. 9, an edge is formed along the vertical direction (e.g., the second direction) of the first region ① and thus a lateral electric field is dispersed, thereby reducing the degree of collection of holes. Therefore, the decrease of the output current due to electrical stress is mitigated compared to FIG. 9, which is the comparative example.

That is, the exemplary embodiment of FIG. 15 may prevent or reduce the decrease of the output current due to strong electrical stress or mechanical stress.

Hereinafter, an asymmetric channel structure of FIG. 16 will be described.

Figure 16:
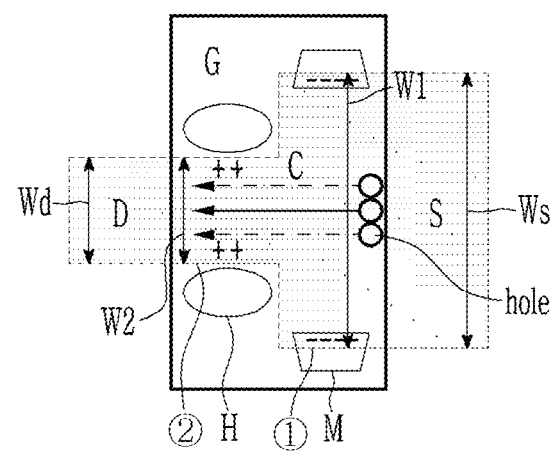

FIG. 16 is an exemplary embodiment in which a width of a source region S is formed to be the same (W1=Ws) as a channel width of a first region ① in addition to the exemplary embodiment of FIG. 15.

Therefore, in an asymmetric channel structure of FIG. 16, unlike the exemplary embodiment of FIG. 7, a width Wd of a drain region D located in a semiconductor layer is formed to be narrower than a width Ws of a source region S, a width Wd of the drain region D is the same as a channel width W2 of a second region ②, and the width Ws of the source region S is the same as the channel width W1 the first region ①. That is, the semiconductor layer of the exemplary embodiment of FIG. 16 only has two widths, and a width of the semiconductor layer may be suddenly changed near the center of the channel region C.

Meanwhile, depending on exemplary embodiments, a middle area may be further included between the first region and the second region near the center of the channel region C, and the middle area may have a channel width (i.e., a middle channel width) that is between the channel width of the first region and the channel width of the second region or a gradually changing channel width (e.g., a channel width that gradually changes from the channel width W1 of the first region ① to the channel width W2 of a second region ②).

In the asymmetric channel structure of FIG. 16, as in FIG. 7, a portion M where electrons are collected is located at an edge in the first region ①, which is away from an area where holes actually flow, and thus the effect of the portion M where the electrons are collected on the decrease of the output current is reduced. Therefore, the decrease of the output current due to mechanical stress is mitigated.

Meanwhile, compared to the structure of FIG. 7, in the asymmetric channel structure of FIG. 16, the number of edges that are adjacent to a portion H where holes are collected is reduced by one. That is, as in the exemplary embodiment of FIG. 15, the drain region D and the second region ② also have the same width in the exemplary embodiment of FIG. 16, and thus there is no vertical edge (e.g., the second direction) in the drain region D compared to the structure of FIG. 7. However, compared to FIG. 9, an edge is formed along the vertical direction (e.g., the second direction) of the first region ① and thus a lateral electric field is dispersed, thereby reducing the degree of collection of holes. Therefore, the decrease of the output current due to electrical stress is mitigated compared to FIG. 9, which is the comparative example.

That is, the exemplary embodiment of FIG. 16 may prevent or substantially prevent the output current from being decreased even when strong electrical stress or mechanical stress is applied.

Hereinafter, an asymmetric channel structure of FIG. 17 will be described.

Figure 17:
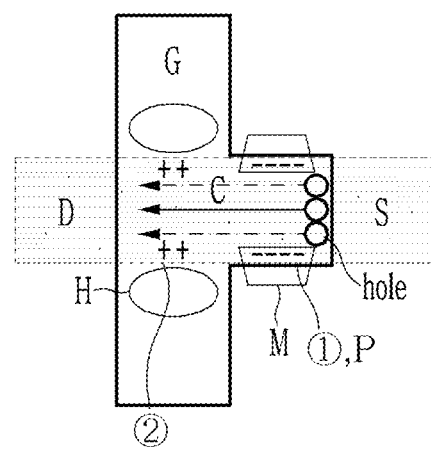

Unlike other exemplary embodiments, in an exemplary embodiment of FIG. 17, a semiconductor layer has a constant width, but a gate electrode G has a protrusion portion corresponding to a channel region C such that an asymmetric structure is formed.

The asymmetric structure according to the exemplary embodiment of FIG. 17 will now be described.

A semiconductor layer of the exemplary embodiment of FIG. 17 extends in a horizontal direction (e.g., the first direction) while having a constant width at a portion where a transistor is located. Thus, a width Ws of a source region S, a width Wd of a drain region D, a channel width W1 of a first region ①, and a channel width W2 of a second region ② may be the same. In this case, a width of the semiconductor layer may have a narrower width like the channel width W2 of the second region ② in the exemplary embodiment of FIG. 7.

A gate electrode G that overlaps the semiconductor layer extends in a vertical direction (e.g., the second direction) that crosses the semiconductor layer at the portion where the transistor is located, and includes a protrusion portion P at a portion crossing the semiconductor. That is, the gate electrode G according to the exemplary embodiment of FIG. 17 includes a linear portion that extends in a direction (e.g., a vertical direction (e.g., the second direction)) crossing the semiconductor layer and a protrusion portion protruded from the linear portion. In one or more embodiments, the protrusion portion may protrude from the linear portion in the horizontal direction (e.g., the first direction) such that the protrusion portion overlaps the semiconductor layer.

The protrusion portion P of the gate electrode G overlaps the first region ① of the semiconductor layer. In addition, three edge sides of the protrusion portion P may match a vertical edge side of the first region ① and a boundary with the source region S. In this case, a width of the protrusion portion P may be the same as the channel width W1 of the first region ①. In addition, a width of the gate electrode G in the horizontal direction (e.g., the first direction) in the portion extending in the vertical direction (e.g., the second direction) may be the same as the width of the semiconductor layer of the exemplary embodiment of FIG. 17.

In the semiconductor layer, a channel region C includes a portion that overlaps the linear portion of the gate electrode G and a portion that overlaps the protrusion portion of the gate electrode G.

The channel region C of the semiconductor layer is an area that is a polycrystalline semiconductor layer and is an area overlapping the gate electrode G on a plane or in a plan view and thus is not doped with an impurity, and the source region S and the drain region D are polycrystalline semiconductor layers and may have characteristics like a conductor or have increased conductivity by being doped with an impurity at a high concentration.

Meanwhile, depending on exemplary embodiments, the protrusion portion P protruded from the gate electrode G has a width that is wider than the width of the semiconductor layer rather than having the same width as the semiconductor layer. In addition, the protrusion portion P may have a structure of which a vertical edge is inclined with respect to the horizontal direction (e.g., the first direction) rather than being horizontally parallel.

Like other exemplary embodiment, in the asymmetric structure of FIG. 17, the transistor may not decrease the output current, and this will be described as follows.

Compared to the structure of the comparative example of FIG. 9, the number of edges adjacent to a portion H where holes are collected is increased by one in the asymmetric structure of FIG. 17. That is, in the exemplary embodiment of FIG. 17, two edges of the gate electrode G, extending in a vertical direction (e.g., the second direction) are disposed adjacent to the portion H where the holes are collected, but, in FIG. 9, only one of edges of the gate electrode G, extending in the vertical direction (e.g., the second direction) is disposed adjacent to the portion H. Thus, comparing the asymmetric structure of FIG. 17 with the comparative example of FIG. 9, a lateral electric field (E-field) is dispersed and thus the degree of collection of holes at the portion H is reduced. Therefore, the decrease of the output current due to electrical stress is mitigated compared to the comparative example of FIG. 9.

Meanwhile, comparing the exemplary embodiment of FIG. 17 with the comparative example of FIG. 9, the exemplary embodiment of FIG. 17 may have a similar characteristic of the comparative example of FIG. 9 in terms of mechanical stress. That is, in the exemplary embodiment of FIG. 17, the portion M where the electrons are collected in the first region ① may be located relatively close to an area where the holes actually flow, and thus the effect of the portion M where the electrons are collected on the decrease of the output current may be similar to that of the comparative example of FIG. 9.

When the channel width of the channel region C in the exemplary embodiment of FIG. 17 is greatly reduced compared to the channel width of the comparative example of FIG. 9, the output current may be decreased due to the portion M where the electrons are collected.

However, this is only considering the mechanical stress, and considering the merit with respect to the electrical stress of the exemplary embodiment of FIG. 17, the output current of the transistor may not be decreased as a whole. When the output current of the transistor is decreased, the channel width of the channel region C of FIG. 17 is formed too narrow, and therefore the width of the semiconductor layer (e.g., the channel width) is increased to prevent or reduce the decrease of the output current.

That is, the exemplary embodiment of FIG. 17 may prevent or reduce the decrease of the output current due to strong electrical stress or mechanical stress.

Hereinafter, an asymmetric channel structure of FIG. 18 will be described.

Figure 18:
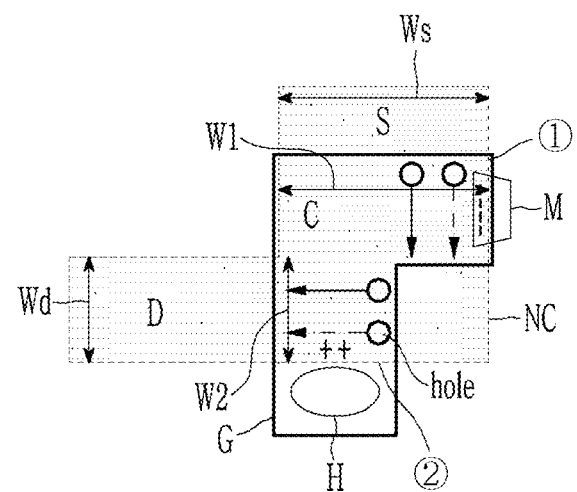

In an exemplary embodiment of FIG. 18, a gate electrode G and a semiconductor layer are bent, and the gate electrode G maintains the same width even through being bent, but in case of the semiconductor layer, widths of a source region S and a first region ① are wide and then narrowed when the semiconductor layer is bent such that a width of a drain region D and a width of a second region ② are narrower than those of the source region S and the first region ①. That is, in the semiconductor layer, a width Ws of the source region S is wider than a width Wd of the drain region D, and a channel width W1 of a portion of the first region ① in the channel region C, contacting the source region S, is formed to be wider than a channel width W2 of the second region ②. In addition, the channel width W1 of the first region ① is the same as the width Ws of the source region S, and the channel width W2 of the second region ② is the same as the width Wd of the drain region D.

In the exemplary embodiment of FIG. 18, the first region ① and the second region ② are connected to each other while being bent. In a portion where a transistor is formed, the source region S and the first region ① of the semiconductor layer extend in a vertical direction (e.g., the second direction), and the drain region D and the second region ② extend in a horizontal direction (e.g., the first direction).

The gate electrode G also has a bent structure, and includes a portion extending in the horizontal direction (e.g., the first direction) and a portion extending in the vertical direction (e.g., the second direction). In the gate electrode G, the portion extending in the horizontal direction (e.g., the first direction) and the portion extending in the vertical direction (e.g., the second direction) may have the same width.

In the semiconductor layer, the source region S and the drain region D do not overlap the gate electrode G, and only the channel region C overlaps the gate electrode G on a plane or in a plan view and thus is not doped.

In addition, in the exemplary embodiment of FIG. 18, a non-channel region NC that is doped at an outer side of the channel region C and does not overlap the gate electrode G may be formed.

The non-channel region NC contacts the channel region C, while contacting the first region ① and/or the second region ②. However, the non-channel region NC is disposed apart from the source region S and the drain region D. Thus, the non-channel region NC passes through the channel region C and then is connected with the source region S and the drain region D.

As shown in FIG. 18, the shape of the non-channel region NC may have a quadrangle structure, but it may have various suitable shapes such as a triangle and a circle.

When holes move to the second region ② from the first region ①, the holes may pass through the non-channel region NC. That is, after the holes move in the vertical direction (e.g., the second direction) in the first region ① that is adjacent to the source region S and thus reach the non-channel region NC, the holes enter the second region ② in the non-channel region NC along the horizontal direction (e.g., the first direction) and then may be transmitted to the drain region D. When the holes are transmitted after passing through the non-channel region NC, the transistor of FIG. 18 may be illustrated as two transistors in a circuit diagram, and this may correspond to the circuit structure of FIG. 12 where only two transistors are illustrated.

In addition, some of the holes may move to the second region ② from the first region ① without passing through the non-channel region NC.

In the asymmetric channel structure of FIG. 18, the transistor does not decrease the output current as in the other exemplary embodiment, and this will now be described.

As shown in FIG. 18, a portion M where electrons are collected in the first region ① is positioned only at the right edge, and is not positioned at the left edge. This is because a main movement path of the holes is mostly formed at the right side of the first region ① as marked by the arrow in FIG. 18. Thus, even though the area of the portion M where the electrons are collected is relatively small, the effect on the holes can be reduced even though it is close to an area where the holes flow. Accordingly, the decrease of the output current due to mechanical stress can be mitigated.

In addition, compared to the comparative example of FIG. 9, in the asymmetric channel structure of FIG. 18, the number of edges that are adjacent to a portion H where the holes are collected is increased by one. That is, in the exemplary embodiment of FIG. 18, two edges of the gate electrode G extending in the vertical direction (e.g., the second direction) are disposed adjacent to the portion H where the holes are collected, but in FIG. 9, only one of edges of the gate electrode G extending in the vertical direction (e.g., the second direction) is disposed adjacent to the portion H. Thus, compared to the comparative example of FIG. 9, a lateral electrical field (E-field) in the horizontal direction is dispersed and the degree of collection of holes in the portion H is reduced in the asymmetric structure of FIG. 18. Therefore, the decrease of the output current due to electrical stress is mitigated compared to the comparative example of FIG. 9.

As described, the exemplary embodiment of FIG. 18 may prevent or reduce the output current due to strong electrical stress or mechanical stress.

In the exemplary embodiment of FIG. 18, the semiconductor layer and the gate electrode G are bent once at 90 degrees, and may be bent several times at various angles.

Hereinafter, an exemplary embodiment in which a middle region ③ is further included between a first region ① and a second region ② near the center of a center region C will be described in more detail with reference to FIG. 19.

A width of the middle region ③ may have a constant value with a channel width (i.e., a middle channel width) that is between a channel width W1 of the first region ① and a channel width W2 of the second region ②, or may have a value that is gradually changed to the channel width W2 of the second region ② from the channel width W1 of the first region ①.

Figure 19:
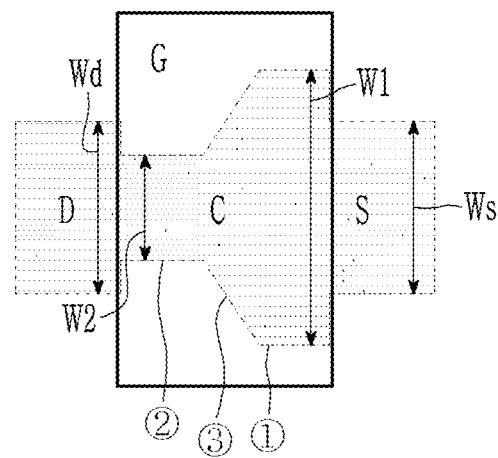

In FIG. 19, an exemplary embodiment in which a width of the middle region ③ is gradually changed is illustrated, which is an exemplary deformation of the exemplary embodiment of FIG. 7.

The middle region ③ is a middle portion of the channel region C, and is irrelevant to a portion M where electrons in the first region ① contacting a source region S are collected or a portion H where holes in the second region ② contacting a drain region D are collected. Thus, the effect of mitigating the decrease of the output current according to the exemplary embodiment of FIG. 7 can be maintained.

As illustrated in FIG. 19, it is also possible to additionally deform the exemplary embodiment of FIGS. 17-18 to further include a middle region ③. However, the present disclosure is not limited thereto. For example, unlike the embodiment of FIG. 19, a width of the middle region ③ may have a constant value with a channel width (i.e., a middle channel width) that is between the channel width W1 of the first region ① and the channel width W2 of the second region ②. While this disclosure has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims, and equivalents thereof.

<Description of some of the symbols>

G: gate electrode
S: source region
NC: non-channel region
111: barrier layer
113: gate insulation layer
300: display area
510, 520: light emitting driver
123: previous scan line
171, 172, 171-1, 172-1: clock signal wire
551: high-level output portion
553: first node_first controller 555: second node_first controller
555-1: first second node_first controller
555-2: second second node_first controller
556: second node_second controller
557: third node controller
FLM: control signal
In1, In2: clock input terminal
②: second region
P: protruding portion C: channel region
D: drain region
110: flexible substrate
112: buffer layer
114: upper insulation layer
410, 420: scan driver
121: scan line
151: light emitting signal line 552: low-level output portion
554: first node_second controller EM: light emitting signal stage
Out: output terminal
①: first region
③: middle region

What is claimed is:

1. A flexible display device comprising:
   a flexible substrate;
   a semiconductor layer on the flexible substrate, the semiconductor layer comprising a polycrystalline semiconductor;
   a gate insulation layer on the semiconductor layer; and
   a gate electrode on the gate insulation layer, the gate electrode overlapping a channel region of the semiconductor layer in a plan view,
   wherein the semiconductor layer comprises a source region and a drain region that are at opposite sides of the channel region,
   wherein the channel region comprises a first region directly contacting and extending from the source region and a second region directly contacting and extending from the drain region, and
   wherein a channel width of the first region is greater than a channel width of the second region and is greater than a width of the source region.

2. The flexible display device of claim 1, wherein a width of the drain region is greater than the channel width of the second region.

3. The flexible display device of claim 1, wherein a width of the drain region is equal to the channel width of the second region.

4. The flexible display device of claim 1, wherein the semiconductor layer and the gate electrode each have a bent structure.

5. The flexible display device of claim 4, wherein a width of the drain region is equal to the channel width of the second region.

6. The flexible display device of claim 1, wherein the channel region comprises a middle area that is between the first region and the second region.

7. The flexible display device of claim 6, wherein a channel width changes along the middle area of the channel region.

8. The flexible display device of claim 1, wherein the flexible substrate comprises a display area and a non-display area, a plurality of pixels being at the display area and a driver to apply a driving signal to the plurality of pixels being at the non-display area, and wherein the driver comprises a transistor comprising the source region, the channel region, the drain region, and the gate electrode.

9. The flexible display device of claim 8, wherein the driver comprises a light emitting driver to provide a light emitting signal to the plurality of pixels, the light emitting driver comprising a plurality of stages.

10. The flexible display device of claim 9, wherein the plurality of stages of the light emitting driver comprises:
a high-level output portion to output a high voltage of the light emitting signal according to a voltage of a first node;
a low-level output portion to output a low voltage of the light emitting signal according to a voltage of a second node;
a first node controller to control the first node, the first node controller comprising a first node first controller and a first node second controller;
a second node controller to control the second node, the second node controller comprising a second node first controller and a second node second controller; and
a third node controller to control a voltage of a third node that controls the first node second controller.

11. The flexible display device of claim 10, wherein at least one of the second node controller or the third node controller comprises the transistor.

12. The flexible display device of claim 11, wherein the second node first controller comprises a first transistor comprising a control electrode connected to a first clock input terminal, an input electrode connected to a control terminal, and an output electrode connected to the second node,
wherein the second node second controller comprises:
the transistor, which is a second transistor, further comprising a control electrode connected to the third node and an input electrode to receive the high voltage of the light emitting signal; and
a third transistor comprising a control electrode connected to a second clock input terminal, an input electrode connected to an output electrode of the second transistor, and an output electrode connected to the second node,
wherein the third node controller comprises:
a fourth transistor comprising a control terminal connected to the second node, an input terminal connected to the first clock input terminal, and an output terminal connected to the third node; and
a fifth transistor comprising a control terminal connected to the first clock input terminal, an input terminal to receive the low voltage of the light emitting signal, and an output terminal connected to the third node.

13. A flexible display device comprising:
a flexible substrate;
a semiconductor layer on the flexible substrate, the semiconductor layer comprising a polycrystalline semiconductor;
a gate insulation layer on the semiconductor layer; and
a gate electrode on the gate insulation layer,
wherein the semiconductor layer comprises a channel region, a source region, and a drain region, the source region and the drain region being at opposite sides of the channel region in a first direction,
wherein the gate electrode comprises:
a linear portion extending in a second direction perpendicular to the first direction and crossing the semiconductor layer to extend beyond both opposite edges of the semiconductor layer in the second direction; and
a protrusion portion protruding from only one side of the linear portion in the first direction, and
wherein the protrusion portion overlaps the channel region of the semiconductor layer in a plan view.

14. The flexible display device of claim 13, wherein the drain region, the source region, and the channel region have a same width.

15. The flexible display device of claim 14, wherein the protrusion portion has a same width as the channel region.

16. The flexible display device of claim 13, wherein the channel region comprises a portion overlapping the linear portion and a portion overlapping the protrusion portion of the gate electrode.

17. A flexible display device comprising:
a flexible substrate;
a semiconductor layer on the flexible substrate, the semiconductor layer comprising a polycrystalline semiconductor;
a gate insulation layer on the semiconductor layer; and
a gate electrode on the gate insulation layer,
wherein the semiconductor layer comprises a channel region, a source region, and a drain region, the source region and the drain region being at opposite sides of the channel region,
wherein the semiconductor layer and the gate electrode each have an asymmetrically bent structure,
wherein a bent direction of the semiconductor layer and a bent direction of the gate electrode are different from each other,
wherein the channel region and the gate electrode overlap each other in a plan view, and
wherein the channel region is at a portion where the semiconductor layer is asymmetrically bent.

18. The flexible display device of claim 17, wherein the channel region comprises a first region contacting the source region and a second region contacting the drain region, and
wherein a channel width of the first region is greater than a channel width of the second region.

19. The flexible display device of claim 18, wherein the semiconductor layer further comprises a non-channel region contacting the channel region, the non-channel region being apart from the source region and the drain region, and
wherein the non-channel region is doped and does not overlap with the gate electrode in a plan view.

* * * * *